US008095542B1

(12) United States Patent
Teugels et al.

(10) Patent No.: US 8,095,542 B1
(45) Date of Patent: *Jan. 10, 2012

(54) METHODS AND APPARATUS FOR ALLOWING ACCESS TO CONTENT

(75) Inventors: Tom Teugels, Schoten (BE); Stephen J. Todd, Shrewsbury, MA (US); Jan F. Van Riel, Geel (BE); Michael Kilian, Harvard, MA (US)

(73) Assignee: EMC Corporation, Hopkinton, MA (US)

( * ) Notice: Subject to any disclaimer, the term of this patent is extended or adjusted under 35 U.S.C. 154(b) by 596 days.

This patent is subject to a terminal disclaimer.

(21) Appl. No.: 11/324,642

(22) Filed: Jan. 3, 2006

(51) Int. Cl.
*G06F 17/30* (2006.01)
*G06F 12/00* (2006.01)

(52) U.S. Cl. ......... 707/747; 707/716; 707/828; 711/202

(58) Field of Classification Search ................ 707/1, 10, 707/100, 102, 205, 200, 705, 822, 828, 829, 707/830, 716, 747, 821; 711/108, 112, 113, 711/114, 202
See application file for complete search history.

(56) References Cited

U.S. PATENT DOCUMENTS

| | | | | |
|---|---|---|---|---|
| 5,276,874 A | * | 1/1994 | Thomson | 707/102 |
| 6,473,846 B1 | * | 10/2002 | Melchior | 711/170 |
| 6,807,632 B1 | * | 10/2004 | Carpentier et al. | 713/165 |
| 7,096,342 B2 | * | 8/2006 | Chiu et al. | 711/216 |
| 7,149,738 B2 | * | 12/2006 | Kumar et al. | 707/9 |
| 7,213,022 B2 | * | 5/2007 | Whelan et al. | 707/10 |
| 7,979,665 B1 | * | 7/2011 | Todd et al. | 711/202 |
| 2004/0220975 A1 | * | 11/2004 | Carpentier et al. | 707/200 |
| 2005/0091469 A1 | * | 4/2005 | Chiu et al. | 711/203 |
| 2006/0059204 A1 | * | 3/2006 | Borthakur et al. | 707/200 |
| 2006/0101060 A1 | * | 5/2006 | Li et al. | 707/102 |
| 2008/0086564 A1 | * | 4/2008 | Putman et al. | 709/227 |

OTHER PUBLICATIONS

Mingfeng et al., High Speed IP Lookup Algorithm with Scalability and Parallelism Based on CAM Array and TCAM, Communications, 2004 IEEE Inter. Conference on, vol. 2, Jun. 20-24, 2004, pp. 1085-1089.*
You et al., Deep Store: An Archival Storage System Architecture, Data Engineering, 2005, ICDE 2005. Proceedings. 21st International Conference on Digital Object Identifier: 10.1109/ICDE.2005.47, Publication Year: 2005, pp. 804-815.*

* cited by examiner

*Primary Examiner* — Greta Robinson
(74) *Attorney, Agent, or Firm* — Muirhead and Saturnelli, LLC

(57) ABSTRACT

In one aspect, two ways of accessing a content unit stored on a CAS are provided, wherein the content unit has a content address that is computed based, at least in part, on at least a portion of its content. A first interface is provided to a file system in which the content unit is logically stored as a logical unit identified by a logical identifier, wherein the content unit is accessed in response to a request to the first interface to access the logical unit and identifying the content unit via the logical identifier. A second interface is provided through which the content unit can be accessed via the content address, wherein the content unit is accessed in response to a request to the second interface to access the content unit and identifying the content unit by the content address.

12 Claims, 14 Drawing Sheets

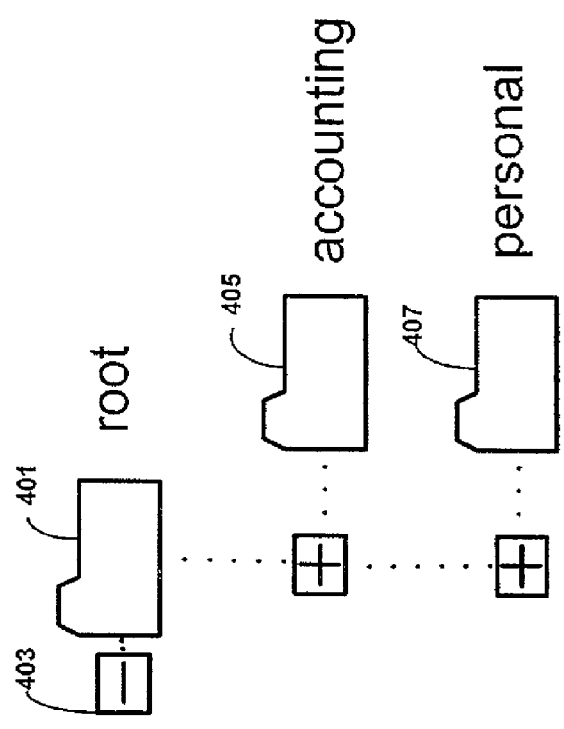

METHODS AND APPARATUS FOR ALLOWING ACCESS TO CONTENT

FIELD OF THE INVENTION

The present invention relates to content addressable storage systems and file systems.

DESCRIPTION OF THE RELATED ART

A file system is a logical construct that may be used to logically stored data in an organized way. A typical file system is made up of a plurality of logical storage spaces referred to as directories or folders. As used herein, the term "directory" and the term "folder" are synonymous. The directories may be arranged in a hierarchical tree or may be arranged in a flat structure. Data may be logically stored in a logical unit of storage referred to as a file and files may be logically stored in the directories or folders of the file system.

The organization of files and directories in a file system may have little or nothing to do with the physical location at which the content logically stored in the files is stored on one or more physical storage device(s) underlying the file system. Thus, the file system software maintains mapping information that maps the logical location of content in the file system (i.e., a file) to the physical location of that content on one or more underlying storage devices.

SUMMARY OF THE INVENTION

One embodiment is directed to a method of implementing a file system in a computer system comprising at least one content addressable storage (CAS) system that stores a plurality of content units each having content, wherein each one of the content units has a content address that is computed based, at least in part, on at least a portion of the content of the one of the content units. The method comprises acts of: creating metadata that defines a directory structure of the file system, wherein the directory structure includes a plurality of directory entries; and storing at least a portion of the metadata in at least one of the plurality of content units on the at least one CAS system, wherein the at least one of the plurality of content units represents at least one of the plurality of directories, and wherein the at least a portion of the metadata stored in the at least one content unit includes references to at least two of the plurality of content units that store content for two entries in the directory structure. Another embodiment is directed to at least one computer readable medium encoded with a plurality of instructions that, when executed, perform the method.

Another embodiment is directed to an apparatus to implement a file system in a computer system comprising at least one content addressable storage (CAS) system that stores a plurality of content units each having content, wherein each one of the content units has a content address that is computed based, at least in part, on at least a portion of the content of the one of the content units. The apparatus comprises at least one processor programmed to: create metadata that defines a directory structure of the file system, wherein the directory structure includes a plurality of directory entries; and store at least a portion of the metadata in at least one of the plurality of content units on the at least one CAS system, wherein the at least one of the plurality of content units represents at least one of the plurality of directories, and wherein the at least a portion of the metadata stored in the at least one content unit includes references to at least two of the plurality of content units that store content for two entries in the directory structure.

A further embodiment is directed to a method of creating a file system to organize in a directory structure a plurality of content units stored on a content addressable storage system, wherein the plurality of content units comprises at least a first content unit and a second content unit, wherein the first content unit references the second content unit. The method comprises acts of: creating a parent directory that represents the first content unit; determining that the first content unit references the second content unit; and based on the determination that the first content unit references the second content unit, creating a file, logically stored in the parent directory, that represents the second content unit. Another embodiment is directed to at least one computer readable medium encoded with a plurality of instructions that, when executed, perform the method.

Another embodiment is directed to an apparatus to create a file system to organize in a directory structure a plurality of content units stored on a content addressable storage (CAS) system, wherein the plurality of content units comprises at least a first content unit and a second content unit, wherein the first content unit references the second content unit. The apparatus comprises at least one processor programmed to: create a parent directory that represents the first content unit; determine that the first content unit references the second content unit; and based on a determination that the first content unit references the second content unit, create a file, logically stored in the parent directory, that represents the second content unit.

A further embodiment is directed to a method of mounting a file system stored on a content addressable storage system, the file system having a directory structure that includes a plurality of directories arranged in a hierarchy wherein the plurality of directories includes a root directory at the top of the hierarchy, wherein each of the plurality of directories is represented by a content unit stored on the content addressable storage system, the content unit having a content address that is computed based, at least in part, on at least a portion of the content of the content unit. The method comprises: specifying the content address of the content unit that represents the root directory; and determining the file system to be mounted based on the content address of the content unit that represents the root directory. Another embodiment is directed to at least one computer readable medium encoded with a plurality of instructions that, when executed, perform the method.

A further embodiment is directed to an apparatus to mount a file system stored on a content addressable storage system, the file system having a directory structure that includes a plurality of directories arranged in a hierarchy wherein the plurality of directories includes a root directory at the top of the hierarchy, wherein each of the plurality of directories is represented by a content unit stored on the content addressable storage system, the content unit having a content address that is computed based, at least in part, on at least a portion of the content of the content unit. The apparatus comprises at least one processor programmed to: specify the content address of the content unit that represents the root directory; and determine the file system to be mounted based on the content address of the content unit that represents the root directory.

A further embodiment is directed to a method of allowing access to a content unit stored on a content addressable storage system, the content unit having a content address that is computed based, at least in part, on at least a portion of the content of the content unit. The method comprises acts of: providing a first interface to a file system in which the content unit is logically stored as a logical unit identified by a logical identifier, wherein the content unit is accessed in response to a request to the first interface to access the logical unit and identifying the content unit via the logical identifier; and providing a second interface through which the content unit can be accessed via the content address, wherein the content unit is accessed in response to a request to the second interface to access the content unit and identifying the content unit by the content address. Another embodiment is directed to at least one computer readable medium encoded with a plurality of instructions that, when executed, perform the method.

A further embodiment is directed to an apparatus to allow access to a content unit stored on a content addressable storage system, the content unit having a content address that is computed based, at least in part, on at least a portion of the content of the content unit. The apparatus comprises at least one processor programmed to: provide a first interface to a file system in which the content unit is logically stored as a logical unit identified by a logical identifier, wherein the content unit is accessed in response to a request to the first interface to access the logical unit and identifying the content unit via the logical identifier; and provide a second interface through which the content unit can be accessed via the content address, wherein the content unit is accessed in response to a request to the second interface to access the content unit and identifying the content unit by the content address.

A further embodiment is directed to a method of implementing a file system in a computer system comprising at least one content addressable storage (CAS) system that stores a plurality of content units each having content, wherein each one of the content units has a content address that is computed based, at least in part, on at least a portion of the content of the one of the content units. The method comprising an act of: in response to receiving a request to write a file in the file system from a source, storing the file in a content unit on the CAS system before acknowledging to the source that file has been stored in the file system. Another embodiment is directed to at least one computer readable medium encoded with a plurality of instructions that, when executed, perform the method.

A further embodiment is directed to an apparatus to implement a file system in a computer system comprising at least one content addressable storage (CAS) system that stores a plurality of content units each having content, wherein each one of the content units has a content address that is computed based, at least in part, on at least a portion of the content of the one of the content units. The apparatus comprises at least one processor programmed to, in response to receiving a request to write a file in the file system from a source, store the file in a content unit on the CAS system before acknowledging to the source that file has been stored in the file system.

A further embodiment is directed to a method for use in a computer system comprising a content addressable storage system, a file system having a directory structure comprising a plurality of directories, and metadata describing the directory structure. The method comprises an act of: retrieving at least some of the metadata describing the directory structure from the content addressable storage system, wherein the at least some of the metadata describing the directory structure is retrieved from at least one content unit stored on the content addressable storage system, wherein the at least one content unit has a content address that is computed based, at least in part, on at least a portion of the content of the at least one content unit. Another embodiment is directed to at least one computer readable medium encoded with a plurality of instructions that, when executed, perform the method.

A further embodiment is directed to an apparatus for use in a computer system comprising a content addressable storage (CAS) system, a file system having a directory structure comprising a plurality of directories, and metadata describing the directory structure. The apparatus comprises at least one processor programmed to retrieve at least some of the metadata describing the directory structure from the content addressable storage system, wherein the at least some of the metadata describing the directory structure is retrieved from at least one content unit stored on the content addressable storage system, wherein the at least one content unit has a content address that is computed based, at least in part, on at least a portion of the content of the at least one content unit.

BRIEF DESCRIPTION OF THE DRAWINGS

FIG. 4A is a graphical depiction of a file system directory structure;

FIG. 4B is an expanded view of the graphical depiction of the file system directory structure of FIG. 4A;

DETAILED DESCRIPTION

Figure 1A:
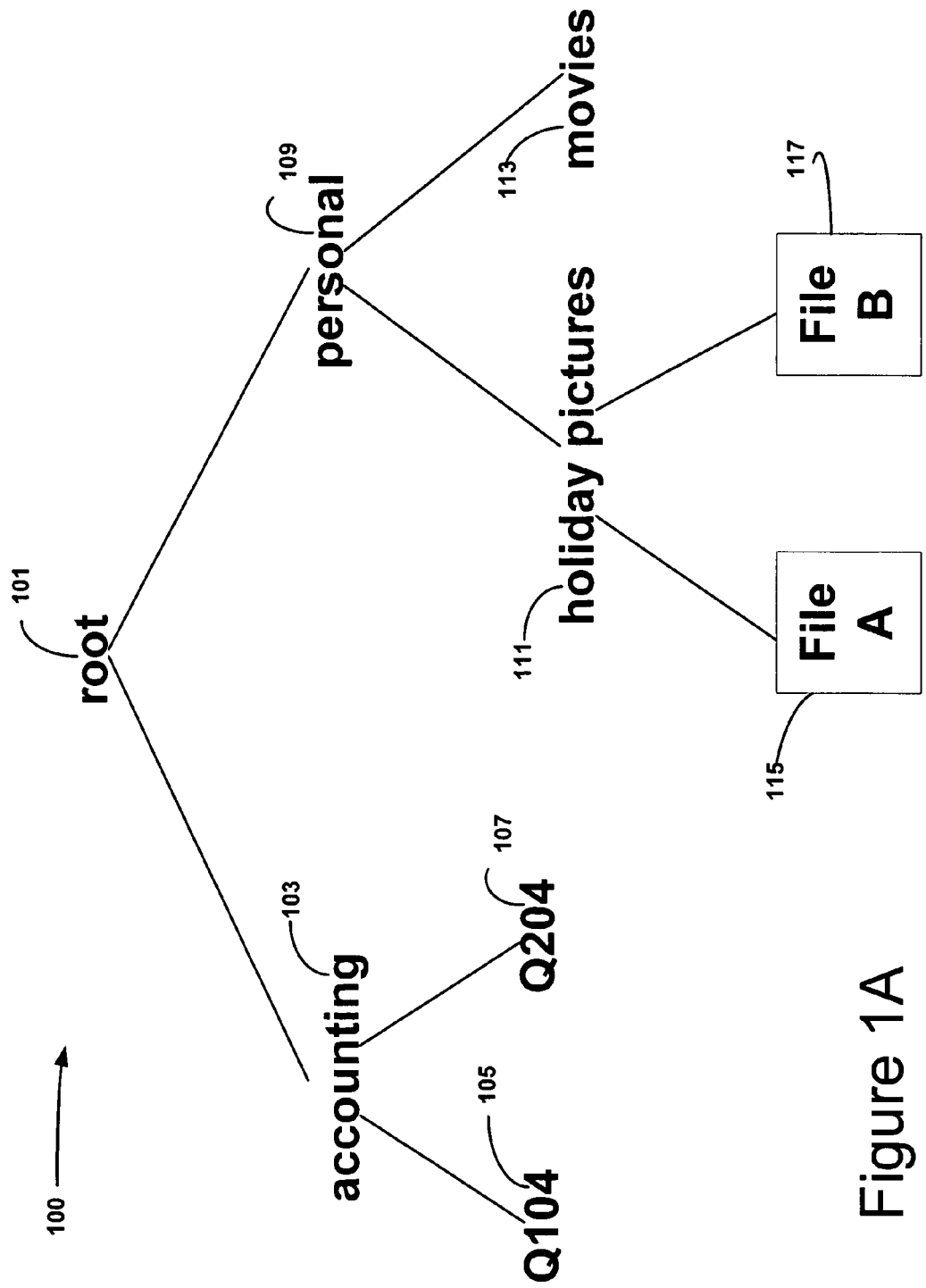
FIG. 1A is a diagram of an example of a directory structure that may be described by content units in a content addressable storage (CAS) system, in accordance with one embodiment of the invention.

Applicants have appreciated that conventional file systems have limitations that may result in increased cost, longer access times, and/or wasted storage space. For example, because the content logically stored in a typical file system is stored on relatively expensive media, such as a high-end or mid-range magnetic disk array, if the size of the data stored in the file system outgrows the amount of storage space available, the purchase of additional expensive storage resources may be required to provide additional storage space for the data of the file system. While some file systems have been stored on less expensive storage media, such as tape or optical disc, the response time for access to the data is slower because the underlying storage device (e.g., the tape device or the optical disc device) is slower than the more expensive storage media devices.

Applicants have also appreciated that a large portion of the content logically stored in a file system may be fixed content. As used herein, fixed content refers to content that, once it is initially stored, is never modified again. Fixed content may include, for example, financial reporting records, medical images (e.g., x-ray images and/or MRI images), regulatory filings, such as SEC filings, and/or other suitable content.

It is common to create a back up copy of a file system, including the content of the file system, the structure of the file system, and the organization of the content with the structure, at a regular interval, such as, for example, daily, weekly, and/or any other suitable interval. However, some conventional backup software programs do not distinguish between fixed content and mutable content (i.e., content that may be modified after it is initially stored). Thus, the fixed content is backed up each time a back up copy of the file system is created, even though the fixed content has not changed since the previous back up copy of the file system was created. While some backup software programs are capable of performing incremental backups (i.e., backups that only back up the content that has changed), users typically perform an incremental back up on a daily basis and a full backup weekly or monthly. This results in wasted storage space on the backup storage media (i.e., because multiple copies of the same content are stored on the backup storage media). Further, the multiple copies of the same content may make restore options take longer if it is ever needed to restore the file system from a back up copy.

Software products exist that attempt to address some of these limitations by reducing the amount of primary storage space needed to store a file system. An example of such a software product is the Legato Disk Extender™, which moves content stored in the file system to an archive device and leaves a stub (that may be used to locate the content on the archive device) in the file system where the content was previously stored. Thereafter, the software intercepts access requests to the file system, determines if the content has been moved to the archive storage device, and, if so, uses the stub to retrieve the content from the archive storage device, and places the content back in the file system. Because some of the content may be stored on the archive storage device (which may use less expensive storage media than the primary storage device underlying the file system), less storage space on the more expensive primary storage media may be used. However, such software products may results in increased access times, because requested content may have to be retrieved from the archive storage device and moved to the primary storage device.

Conventional file systems often have object count limits that limit the number of files and/or other logical objects that may be stored therein. Thus, even though physical storage space is available to for storage additional content, it may not be possible to storage additional content in the file system because the limit on the number of logical objects permitted in the file system has been reached.

The foregoing provide some examples of limitations that arise from rendering a file system on a block I/O storage system. One embodiment of the invention is directed to a file system rendered on a CAS system. Various embodiments of the invention may address some or all of the above-discussed limitations of file systems rendered on a block I/O storage system. However, some embodiments of the invention may address only some or not any of these limitations, and it should be appreciated that the invention is not limited to addressing or providing a solution to any or all of these limitations of conventional file systems.

One embodiment is directed to a content addressable file system. A content addressable file system is a file system wherein the directory structure of the file system is described by metadata stored in one or more content addressable content units. A content addressable content unit is a unit of content that is associated with a content address that is computed, at least in part, from at least a portion of the content of the content unit. The content address of a content unit may then be used to refer to and access the content unit. The directory structure may be described by the content units in any suitable way, as this embodiments is not limited in this respect.

In one embodiment, each directory in the directory structure and file stored in one of the directories in the directory structure can be represented by a different content unit. A content unit that represents a directory may indicate, for example, in the content of the content unit, any subdirectories and/or files of the directory it represents and the content addresses of the content units that represent those subdirectories and/or files. An illustrative directory structure 100 is shown in FIG. 1A. Directory structure 100 includes a root directory 101, which has two subdirectories (i.e., accounting directory 103 and personal directory 109). Accounting directory 103 has subdirectories Q104 directory 105 and Q204 directory 107, and personal directory 109 has subdirectories holiday pictures directory 111 and movies directory 113. There are two files logically stored in holiday pictures directory 111 (i.e., file A 115 and file B 117).

Figure 1B:
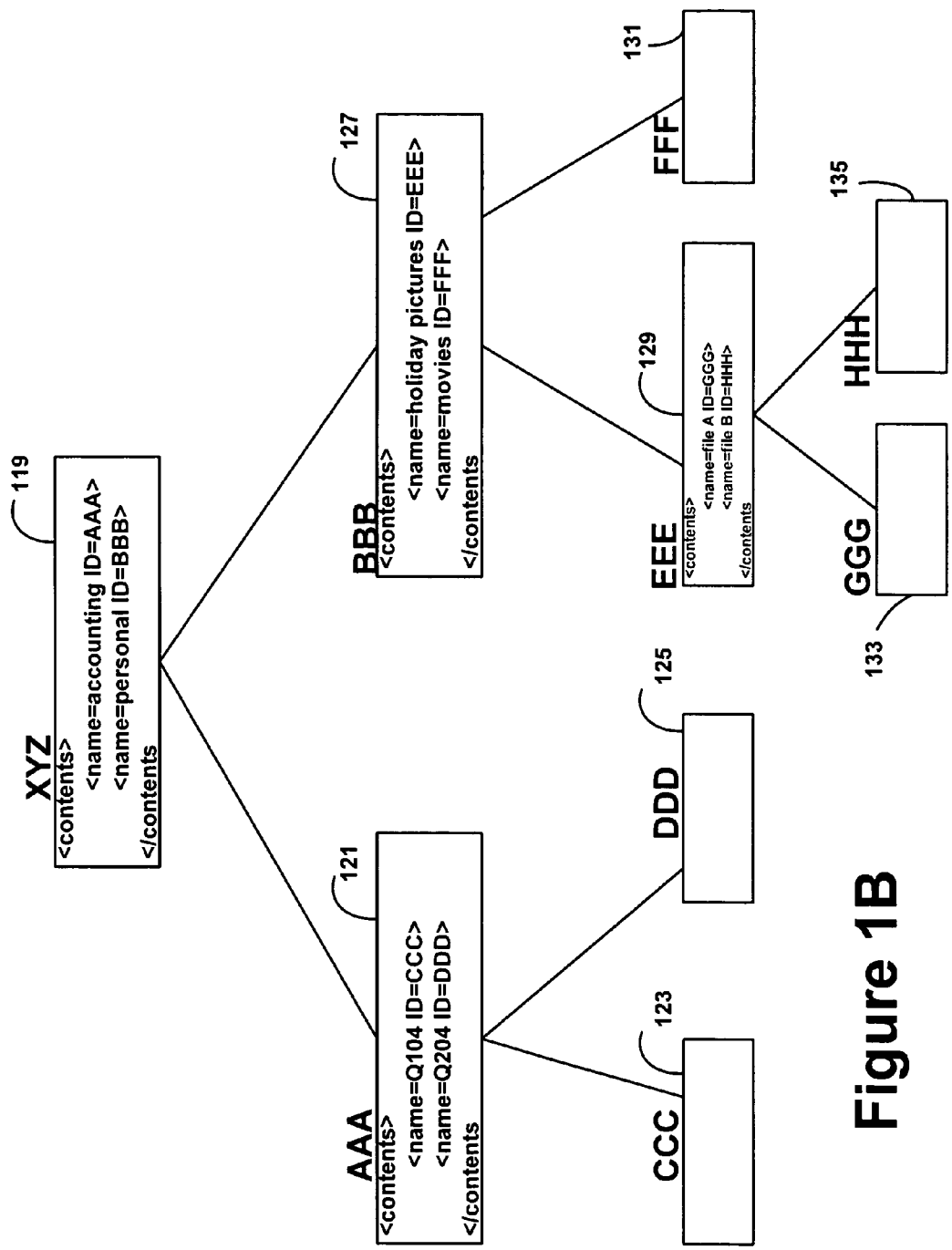
FIG. 1B is a diagram of content units that describe the directory structure of FIG. 1A, in accordance with one embodiment.

In accordance with one embodiment, the directory structure of FIG. 1A may be described by content stored in content addressable content units. FIG. 1B shows one illustrative way of describing the directory structure 100 of FIG. 1A by a plurality of content units. Content unit 119 has a content address 'XYZ' and represents the root directory 101. The content of content unit 119 indicates that there are two subdirectories of the directory represented by content unit 119. That is, content unit 119 has a subdirectory named 'accounting' which is represented by a content unit 121 having the content address 'AAA' and a subdirectory named 'personal' which is represented by a content unit 127 having the content address 'BBB.' Thus, content unit 121 represents the 'accounting' subdirectory and has the content address 'AAA' and content unit 127 represents the 'personal' subdirectory and has a content address 'BBB.' The content of content unit 121 indicates that the accounting subdirectory has two subdirectories (i.e., the Q104 directory represented by a content unit 123 having the content address 'CCC' and the Q204 directory represented by a content unit 125 having the content address 'DDD'). Thus, content unit 123 represents the Q104 subdirectory and content unit 125 represents the Q204 subdirectory.

Similarly, the content of content unit 127 indicates the personal subdirectory also has two subdirectories (i.e., the holiday pictures directory represented by a content unit 129 having the content address 'EEE' and the movies directory represented by a content unit 131 having the content address 'FFF'). Content unit 129 (which represents the holiday pictures directory) indicates that there are two files stored in the holiday pictures directory: file A which is represented by content unit 133 having a content address 'GGG' and including the content of file A; and file B which is represented by content unit 135 having a content address 'HHH' and including the content of file B. The content units that describe the directory structure may be stored in any suitable physical location, as the invention is not limited in this respect.

In one embodiment, these content units may be stored on a content addressable storage (CAS) system. A CAS system is a storage system where a content unit may be accessed by specifying the content address of the content unit (e.g., in an access request sent to the CAS system).

Figure 2:
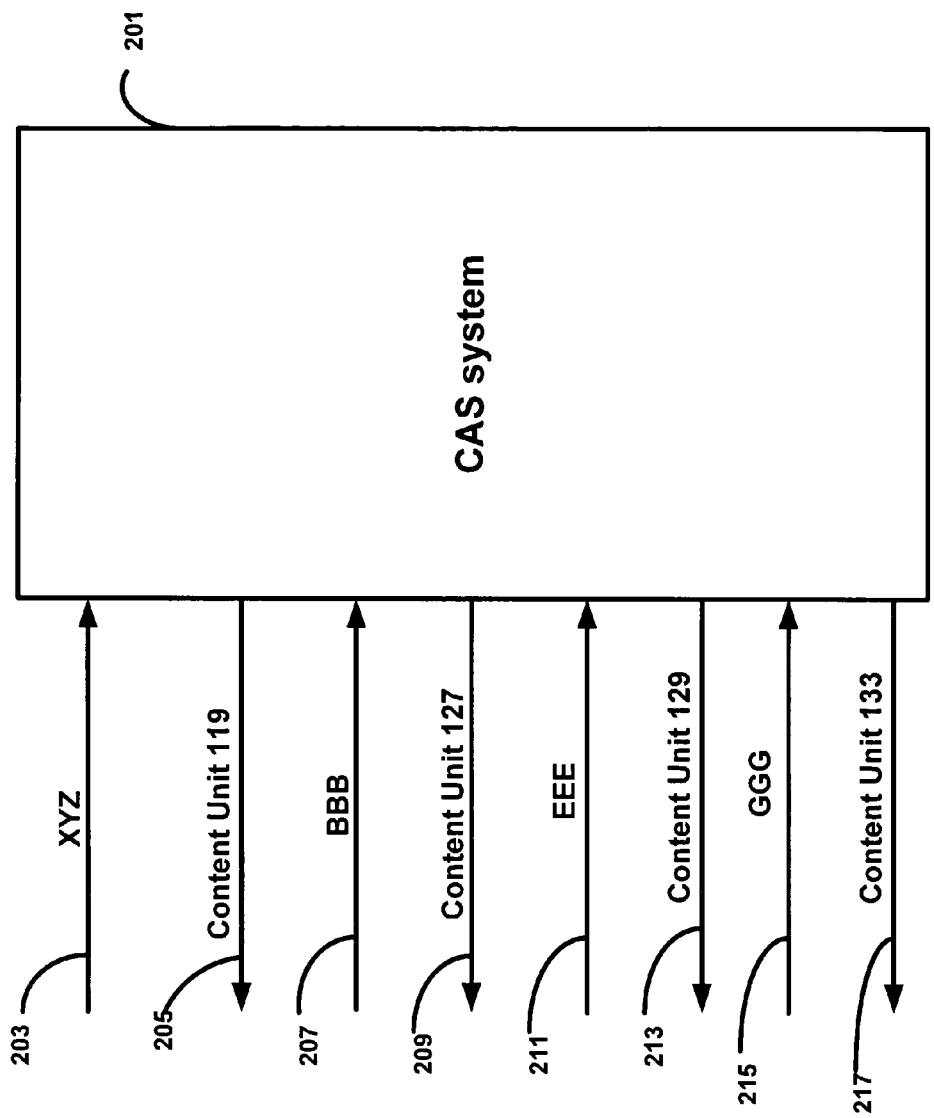
FIG. 2 is a diagram of a CAS system processing access requests for content units that describe a directory structure, in accordance with one embodiment.

When the directories and files are stored as content units, any directory or file may be accessed based on knowledge of where it is located in the file system and based on knowing the content address of the content unit representing the root directory. For example, if it is known that file A is stored in the directory path root/personal/holiday pictures, the content of file A may be accessed as shown in FIG. 2. FIG. 2 shows a CAS system 201 which stores the content units shown in FIG. 1B. If it is known that the root directory of the directory structure is represented by the content unit having a content address 'XYZ,' a request 203 may be sent to CAS system 201 to access the content unit corresponding to the root directory and may identify the content unit by its content address (i.e., 'XYZ'). In response, CAS system 201 may return a response 205 that includes content unit 119, which represents the root directory. Based on the content of this content unit, it may be determined that the content address of the content unit that represents the 'personal' subdirectory is 'BBB.' Thus, a request 207 may be sent to CAS system 201 to access the content unit having the content address 'BBB' and a response 209 may be returned by the CAS system that includes content unit 127, which represents the 'personal' subdirectory. Based on the content of content unit 127, it may be determined that the content address of the content unit that represents the 'holiday pictures' subdirectory is 'EEE' and a request 211 may be sent to CAS system 201 for this content unit. In response, CAS system 201 may return a response 213 that includes content unit 129, which corresponds to the 'holiday pictures' subdirectory. Based on the content of content unit 129, it may be determined that File A, the desired file, has the content address 'GGG' and a request 215 may be sent to CAS system 201 requesting the content unit having the content address 'GGG.' In response, CAS system 201 may return a response 217 that includes content unit 133, which stores the content of File A.

Applicants have appreciated that accessing a file by specifying a series of content addresses may be cumbersome to users, particularly those who are accustomed to accessing files in a file system by inputting file system commands to a command line interface or by using a mouse to navigate through a graphical representation of the file system. As used herein, a user may be a human operator, an application program, a computer, or any other suitable user.

In one embodiment, the file system may be accessed by a user in a manner similar to accessing conventional file systems. These user accesses may be translated to content addressable requests to access a content unit or content unit related to the request and the appropriate information may be retrieved from the content unit and returned to the user. This may be done in any suitable way, as the invention is not limited in this respect.

Figure 3:
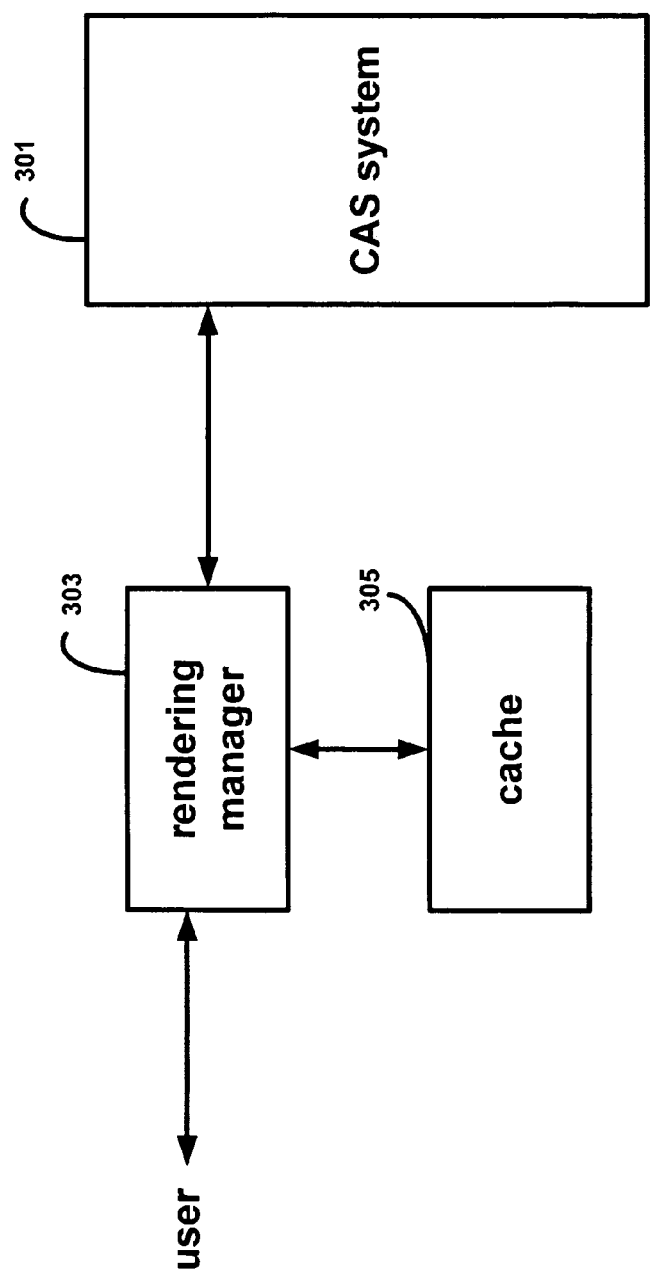
FIG. 3 is a block diagram of a computer system in which a content addressable file system may be employed, in accordance with one embodiment.

An example is shown in FIG. 3, wherein a user access request to the file system (e.g., a command line command or a point and click on a graphical representation of the file system) may be received by rendering manager 303. Rendering manager 303 may translate the access request into a request, or set of requests, to a CAS system 301 on which the content units describing the file system are stored. Rendering manager 303 may receive the appropriate content unit or content units from CAS system 301, extract the appropriate information from the content unit(s), and return the information to the user in any desired form (e.g., including forms to which users are accustomed). In one embodiment, rendering manager 303 utilizes a cache 305 to cache content units that form part of the directory structure received from CAS system 301. Thus, a request to CAS system 301 need not be sent every time it is desired to access a content unit stored thereon, as the content unit may already be stored in cache 305 and retrieved therefrom. However, the invention is not limited to use of a cache, as in some embodiments, rendering manager 303 may not cache content units received from the CAS system.

Rendering manager 303 may translate user accesses to content addressable requests in any suitable way, as the invention is not limited in this respect. In one embodiment, command line interface file system commands may be received by rendering manager 303 and translated into content addressable access requests, which the rendering manager may then send to CAS system 301. For example, as shown in Table 1 below, a user may access the file system using Linux or UNIX file system commands. The user may input the command 'cd root,' which is a command to change the current directory to the root directory. This command may be received by rendering manager 303 which, in response, may request the content unit corresponding to the root directory from CAS system 301. If this content unit is already stored in cache 305, rendering manager 303 need not request the content unit from CAS system 301, but may retrieve it from cache 305. As can be seen in Table 1, the user need not specify the content address of the content unit corresponding to the root directory in the 'cd root' command. Rather, rendering manger may determine the content address of the root directory without the content address being specified in the command. This may be done in any suitable way, as the invention is not limited in this respect. Examples of techniques of determining the content unit that represents the content address of the root directory are discussed in greater detail below.

In response to the 'cd root' command received from the user, rendering manager 303 may send a request to CAS system 301 to access the corresponding content unit. As an example, the file system stored on CAS system 301 may be the file system of the example of FIG. 1B, and the request from rendering manager 303 to CAS system 301 may be a request for a content unit having the content address 'XYZ.' Thus, the CAS system may, in response to the request, return content unit 119.

As shown in Table 1, the user next enters an command. The command is a command to list the contents of the current directory (which is now the root directory). Rendering manager 103 may receive the 'ls' command and, in response, may determine the content of the root directory. This may be done in any suitable way as the invention is not limited in this respect. For example, the contents of the root directory may be determined by reading the content of content unit 119, which represents the root directory. Content unit 119 indicates that there are two subdirectories of the root directory (i.e., the accounting subdirectory and the personal subdirectory), thus in response to the ls command, rendering manager 303 may cause the contents of the directory to be displayed to the user, as shown in Table 1.

The user may subsequently input the command 'cd personal' which is a command to change the current directory to the 'personal' subdirectory of the root directory. In response, rendering manager 303 may determine the content address of the content unit that represents the 'personal' subdirectory and may send a request to CAS system 301 to access the content unit. As shown in Table 1, the user may then input another 'ls' command to list the contents of the current directory (i.e., the 'personal' directory) and rendering manager 303 may read the contents of the content unit (i.e., content unit 127) that represents the 'personal' directory and cause them to be displayed to the user. Content unit 127 indicates that the 'personal' directory has a 'holiday pictures' subdirectory and a 'movies' subdirectory. Thus, this information may be displayed to the user, as shown in Table 1. The user may then input a 'cd holiday pictures' command, which is a command to change the current directory to the 'holiday pictures' directory. In response, rendering manager 303 may request the content unit that represents this directory from CAS system 301. As discussed above, if the user subsequently inputs an 'ls' command to list the contents of the current directory, rendering manager 303 may read the contents of the content unit that represents the 'holiday pictures' directory and cause this information to be displayed to the user.

TABLE 1

> cd root
> ls
accounting/
personal/
>cd personal
>ls
holiday pictures/
movies/
>cd holiday pictures
>ls
file A
file B Rendering manager 303 may also translate user accesses via a graphical user interface (e.g., a graphical depiction of the directory structure) into content addressable access requests to the content units that describe the file system. For example, as shown in FIG. 4, a graphical depiction of the file system includes an icon 401 for the root directory. The user may input a command to see the contents of root directory by selecting the '+' symbol in box 403 associated with icon 401 using an input device such as a mouse or a keyboard, by selecting the folder icon itself, or in any other suitable way.

The users' actions on the graphical user interface may be translated into file system commands, such as those shown above in Table 1. This may be done in any suitable way and by any suitable software entity. For example, such translation may be performed by the operating system of the user's computer, by rendering manager 403, or by any other suitable entity. The selection of box 403 or the folder icon 401 may be translated, for example, as an 'ls' command to see the contents of the root directory. The translated command may be received be rendering manager 303. In response, rendering manager 303 may access the contents the content unit corresponding to the root directory (i.e., content unit 119), may read the information from this content unit, and may cause the information in content unit 119 indicating the contents of the root directory to be displayed in graphical form to the user. For example, as shown in FIG. 4B, the accounting directory and the personal directory, respectively, are displayed as subdirectories of the root directory.

Figure 5A:
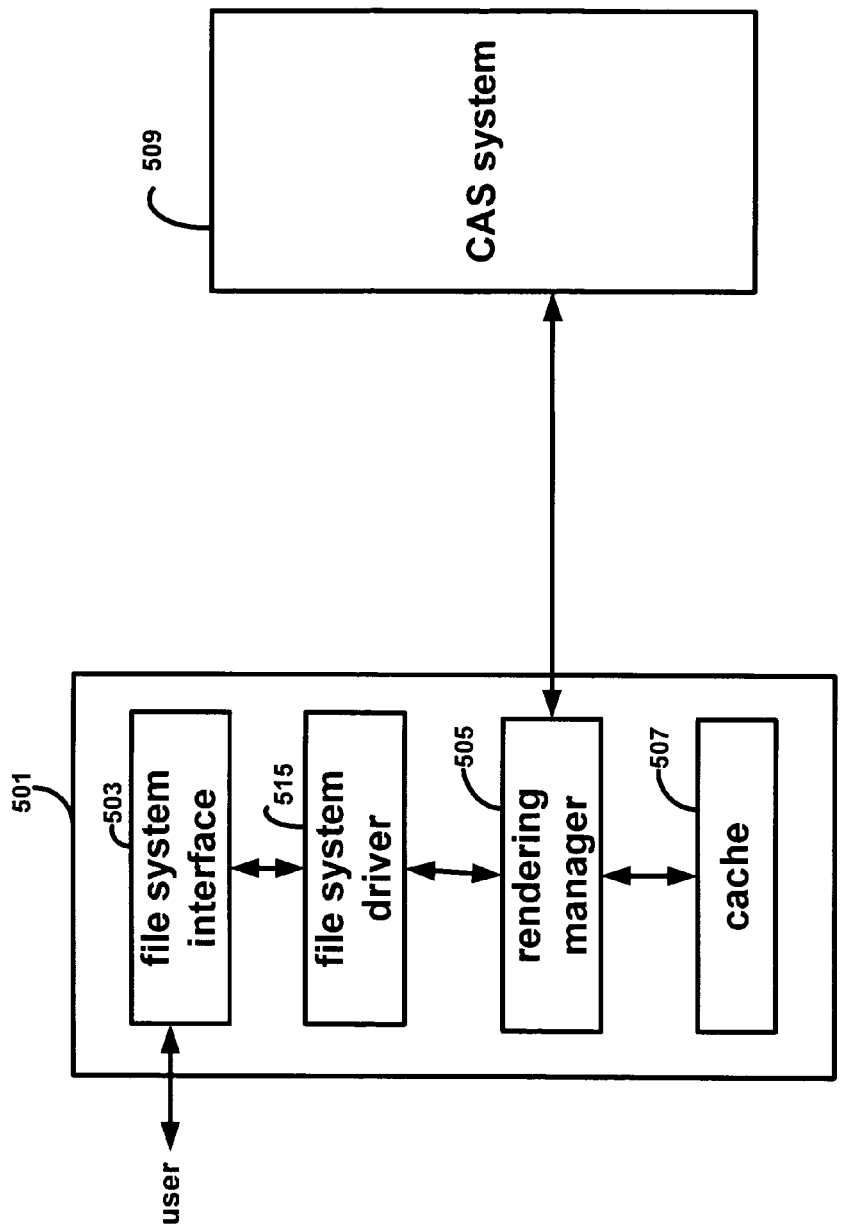
FIG. 5A is a diagram of a computer system in which a rendering manager that renders a content addressable file system executes on a host computer, in accordance with one embodiment.

Rendering manager 303 may be implemented in any suitable way, as the invention is not limited in this respect. In one embodiment, rendering manager 303 may be implemented as a software program or a set of software routines. The rendering manager software may execute on any suitable device or computer, as the invention is not limited in this respect. In one embodiment, rendering manager 303 may execute on a host computer 501 through which a user accesses the file system, as shown in FIG. 5A. FIG. 5A shows the host computer 501, and a CAS system 509 on which the content units that describe the file system are stored. A user may access the file system through a file system driver 515 of host computer 501. Host computer 501 may provide (e.g., via the operating system executing thereon) a file system interface 503, which may include a command line interface and/or a graphical user interface presented to the user of host computer 501. File system interface 503 may interface with file system driver 515 to send user accesses to rendering manager 505.

File system driver 515 may be configured to send user access requests to rendering manager 505 in any suitable way. That is, the content addressable file system may be mounted on the host computer, for example, by including the content address of the content unit that represents the root directory of the content addressable file system in a mount command and specifying the rendering manager 505 as the source device. As a result, access requests to the content addressable file system may be forwarded to rendering manager 505 through file system driver 515, and rendering manager 505 may provide information, including the content of files and directory structure information, back to the user through file system driver 515.

Rendering manager 505 may translate the user commands into content addressable access requests and may request any content units stored on CAS system 509 to retrieve information for responding to the access requests. Rendering manager 505 may then extract the information needed to respond to the request and may provide this information to file system driver 515 so that file system interface 503 may display the information to the user.

Write requests (i.e., requests to create content stored in a file in the file system) originated by a source (e.g., a human user, an application program, or a host computer) may be received by rendering manger 505. Rendering manager may translate the write request into a content addressable access request to store the content in a content unit on CAS system 509. After the CAS system 509 has stored the content in a content unit, CAS system 509 may acknowledge to rendering manager 505 that the file has been stored. Rendering manager 505 may forward this acknowledgment to the source of the write request.

In one embodiment, the content address of the content unit that represents the root directory may be provided to the rendering manager. This may be done in any suitable way, as the invention is not limited in this respect. For example, the content address of the root directory may be specified in the mount command to mount the content addressable file system.

In another embodiment one or more, profile content units may be used to determine the content address of the content unit that represents the root directory. A profile content unit is a content unit stored on the content addressable storage system that is associated with a particular user (e.g., via a login name). The profile content unit for a user may be created at any suitable time and may include any suitable information relating to the user.

For example, the profile content unit may be created when a user first creates a content addressable file system to be stored on the CAS system and the profile content unit may include, for example, the content address of the content unit that represents the root directory of the file system that the user accesses. In some embodiments, the profile content unit may include multiple content addresses for multiple content units, wherein each of the content units represents the root directory of a different file system. Thus, a user may have access to multiple different file systems that each is stored on the CAS system.

To determine the content address of the content unit that represents the root directory, the rendering manager may send an access request to the CAS system for the profile content unit of the user (e.g., based on the identity of the host computer or the identity of the user logged in to the host computer) requesting to mount the file system. The rendering manager may then retrieve the content address of the content unit that represents the root directory from the profile content unit.

The network address of the CAS system (e.g., the IP address when used in a TCP/IP network) may be provided to the rendering manager so that it may determine where (i.e., to what network address) to send the content addressable access requests. The network address may be provided in any suitable way, as the invention is not limited in this respect. For example, in one embodiment, the network address of the CAS system may be specified in the mount command to mount the content addressable file system and once it is specified, the rendering manager may store it for later use. In another embodiment, the rendering manager may be configured by the user to use a particular network address, or the operating system of the host computer may be configured to provide a particular network address to the rendering manager.

Figure 5B:
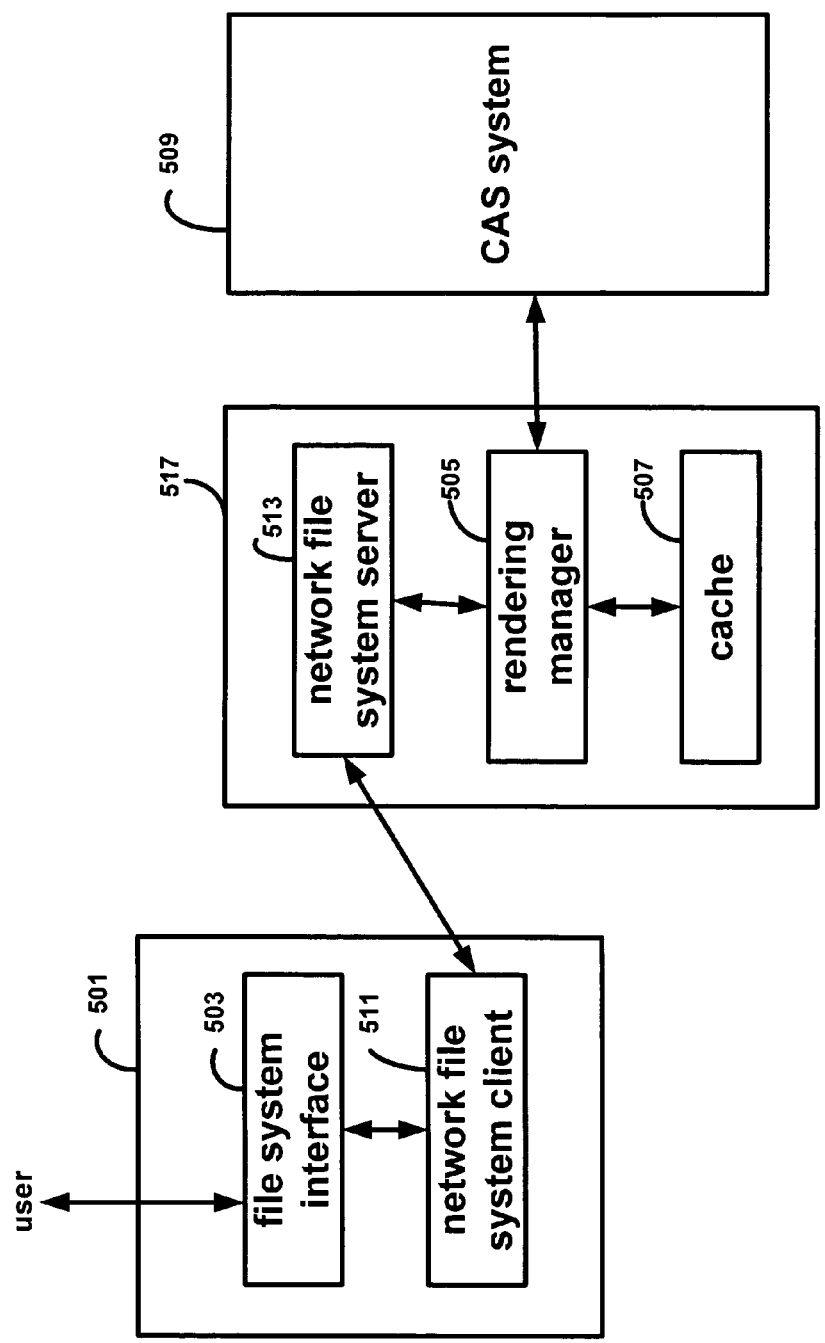
FIG. 5B is a diagram of a computer system in which a rendering manager that renders a content addressable file system executes on an appliance, in accordance with one embodiment.

In another embodiment, the rendering manager may be implemented on an appliance that is separate from the host computer and the CAS system, rather than on the host computer. For example, as shown in FIG. 5B, the host computer executes file system interface 503, which may provide a command line interface or graphical user interface to the user. File system interface 503 interfaces with network file system client 511, which is capable of communicating (e.g., over a network or other medium) with a network file system server.

Appliance 517 implements a network file system server 513 and rendering manager 505. Rendering manager 505 communicates (e.g., over a network or other medium) with CAS system 509. A user may access the content addressable file system through file system interface 503. Network file system client 511 may then send the access requests to network file system server 513, which forwards the access requests to rendering manager 505. Rendering manager 505 may operate as discussed above to retrieve content units that include directory structure information and the content of files from CAS system 509 and may provide this information to the user via network file system server 513. As discussed above, rendering manager 505 optionally may store information received from CAS system 509 in cache 507 so that if the information is subsequently accessed, it may not be necessary to retrieve the information again from CAS system 509.

Network file system client 511 and network file system server 513 may implement any type of network file system, as the invention is not limited in this respect. For example, network file system client 511 and server 513 may implement the network file system (NFS) or the common interne file system (CIFS).

Figure 5C:
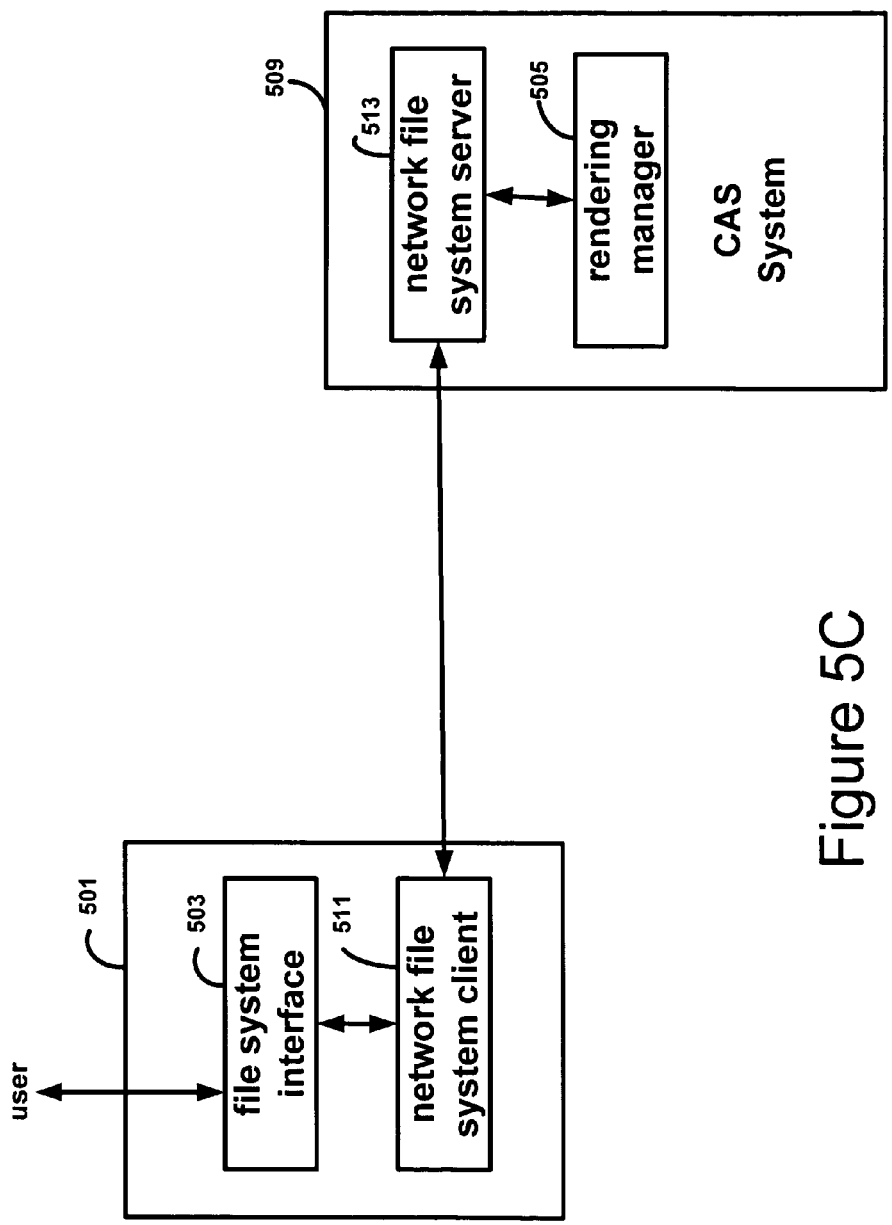
FIG. 5C is a diagram of a computer system in which a rendering manager that renders a content addressable file system executes on a CAS system, in accordance with one embodiment.

In another embodiment, the rendering manager may be implemented on the CAS system. For example, as shown in FIG. 5C, host computer 501 executes file system interface 503 and network file system client 511. CAS system 509 executes network file system server 513 and rendering manager 505. Rather than forwarding access requests to an appliance, as in FIG. 5B, network file system client 511 forwards access requests to network file system server 509 executing on CAS system 509. Network file system server 509 may then forward these access requests for processing to rendering manager 505, which is implemented on the CAS system.

In one embodiment, content units that describe the directory structure may include content in addition to the information describing the directory structure. For example, a content unit corresponding to the 'holiday pictures' directory (FIG. 1A) might, in addition to indicating that File A and File B are stored in that directory, provide metadata about the content of File A and/or the content of File B. Such metadata might indicate that File A is a picture having the caption "Christmas Dinner" and that File B is a picture having the caption "Beach Vacation."

The metadata in a content unit may be formatted in any suitable way, as the invention is not limited in this respect. In one embodiment, the metadata is formatted according to the extensible markup language (XML).

Applicants have appreciated that users may desire to view the metadata that is included in a content unit (including the directory structure information) and may also desire to know the content address of the content unit that represents a particular directory or file (even though it is not required to have the content address to access the content unit). This may be done in any suitable way, as the invention is not limited in this respect. In one embodiment, rendering manager 505 may present to the user (e.g., via the file system interface and/or other intermediary software) one or more additional files as being logically stored in each directory, even though there are no content units that represent these files and no information stored in any of the content units that indicate the existence of such files. That is, for example, referring to FIG. 1B, content unit 119, which represents the root directory, indicates that there are no files stored in the root directory, but there are two subdirectories (i.e., accounting and personal). However, upon a request to view the contents of the root directory, rendering manager 505 may, in addition to presenting the accounting subdirectory and the personal subdirectory, present one or more additional files. The one or more additional files, referred to herein as virtual files, are presented to allow a user to access the metadata and/or the content address of a content unit. A virtual file may be thought of as being virtually stored in a directory of the directory structure.

In one embodiment, the rendering manager may present two virtual files as being virtually stored in each directory or subdirectory. The first virtual file may be a CAS-ID file. When a user accesses the content of a CAS-ID file, rendering manager 505 may return the content address of the content unit that represents the directory in which the CAS-ID file is virtually stored. For example, referring to FIG. 1B, if a user accesses the CAS-ID file virtually stored in the root directory, rendering manager 505 may return the content address 'XYZ.'

The second virtual file presented by rendering layer 505 may be a CAS-meta file. When a user accesses the CAS-meta file, rendering manager 505 may return the metadata stored in the content unit that represents the directory in which the CAS-meta file is virtually stored. Thus, for example, if a user accesses the CAS-meta file of the content unit that represents the 'holiday pictures' directory, rendering manager 505 may return the information indicating that there are two files logically stored in the 'holiday pictures' directory (i.e., file A and file B) and may also return the metadata described in the example above, indicating that file A is a picture and having the caption "Christmas Dinner" and that file B is a picture having the caption "Beach Vacation."

In the examples above, rendering manager 505 provides two virtual files for each directory, one associated with content address of a content unit and another associated with the metadata of content unit. It should be appreciated that the invention is not limited to providing both of these files, as in some embodiments only one of these files (either the CAS-ID file or the CAS-meta file) is provided. In another embodiment, only a single virtual file is provided, but the virtual file includes the information of both the CAS-ID file and the CAS-meta file. Thus, for example, when a user accesses such a virtual file, rendering manager 505 may provide the content address of the content unit and the metadata of the content unit.

As discussed above, the content address for a content unit is computed, at least in part, from at least a portion of the content of the content unit. This may be done in any suitable way, as the invention is not limited in this respect. For example, the content of the content unit (or a portion thereof) may be input into a hash function which generates a hash value using the input. This hash value may be used as the portion of the content address generated from the content of the content unit. Applicants have appreciated that while the content stored in a file system may be fixed content, it may be desirable to alter the directory structure of the file system. Thus, for example, referring to FIG. 1B, while the content of content unit 133 may be fixed (i.e., because it is a photograph that it is not desirable to alter), it may be desirable to logically store another photograph in the directory represented by content unit 129 (i.e., the 'holiday pictures' directory) or to create another directory that is a subdirectory of the 'holiday pictures' directory (e.g., a 'christmas pictures' directory).

Figure 6A:
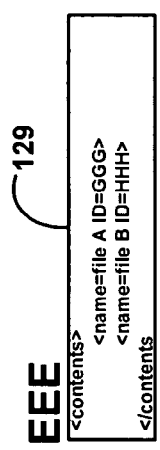
FIG. 6A is a diagram of a content unit that represents a file system directory, in accordance with one embodiment.
Figure 6B:
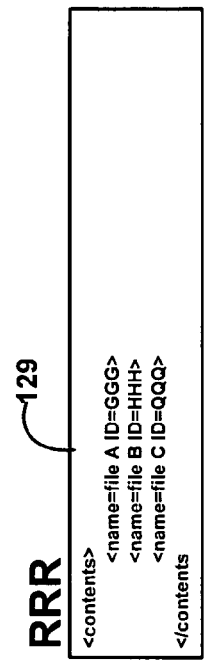
FIG. 6B is a diagram of the content unit of FIG. 6A after an additional file is stored in the directory represented by the content unit, in accordance with one embodiment.

Applicants have appreciated that, if the content address is computed using the entire content of the content unit, then changing the contents of a directory may result in a change in the information stored in the content unit that represents the directory. For example, as shown in FIG. 6A, content unit 129 which represents the 'holiday pictures' directory and includes an indication that file A and file B are stored therein yields the content address 'EEE.' However, if a third file, file C, is logically stored in the 'holiday pictures' directory, the content of content unit 129 may be updated to reflect this addition, as shown in FIG. 6B. Because the content of content unit 129 has changed, the content unit may have a new content address, 'RRR'. Thus, referring to FIG. 1B, the content of content unit 127, which represents the 'personal' subdirectory, may be updated to indicate that the 'holiday pictures' subdirectory has a content address of 'RRR,' rather than 'EEE.' Updating this information in content unit 127 may cause the content address of content unit 127 to change from 'BBB' to, for example, 'SSS.' Accordingly, the content of content unit 119, which represents the root directory, may be updated to reflect the new content address of the content unit that represents the 'personal' subdirectory. Of course, updating this information in content unit 119 may also cause the content address of content unit 119 to change. Thus, as can be seen from the example above, a change in the directory structure at a particular level may cause a ripple effect which results in a change of a content unit at every level in the directory structure that is higher than the level at which the initial change occurred.

To address this, in one embodiment, the content of content units may be altered without the alterations resulting in a change in the content address of the content unit. This may be done in any suitable way, as the invention is not limited in this respect.

For example, in one embodiment, the content address of a content unit may be computed from a portion of the content unit that may never change. However, other portions of the content unit may be changed to reflect additions, modifications, or deletions to the directory structure.

Figure 7:
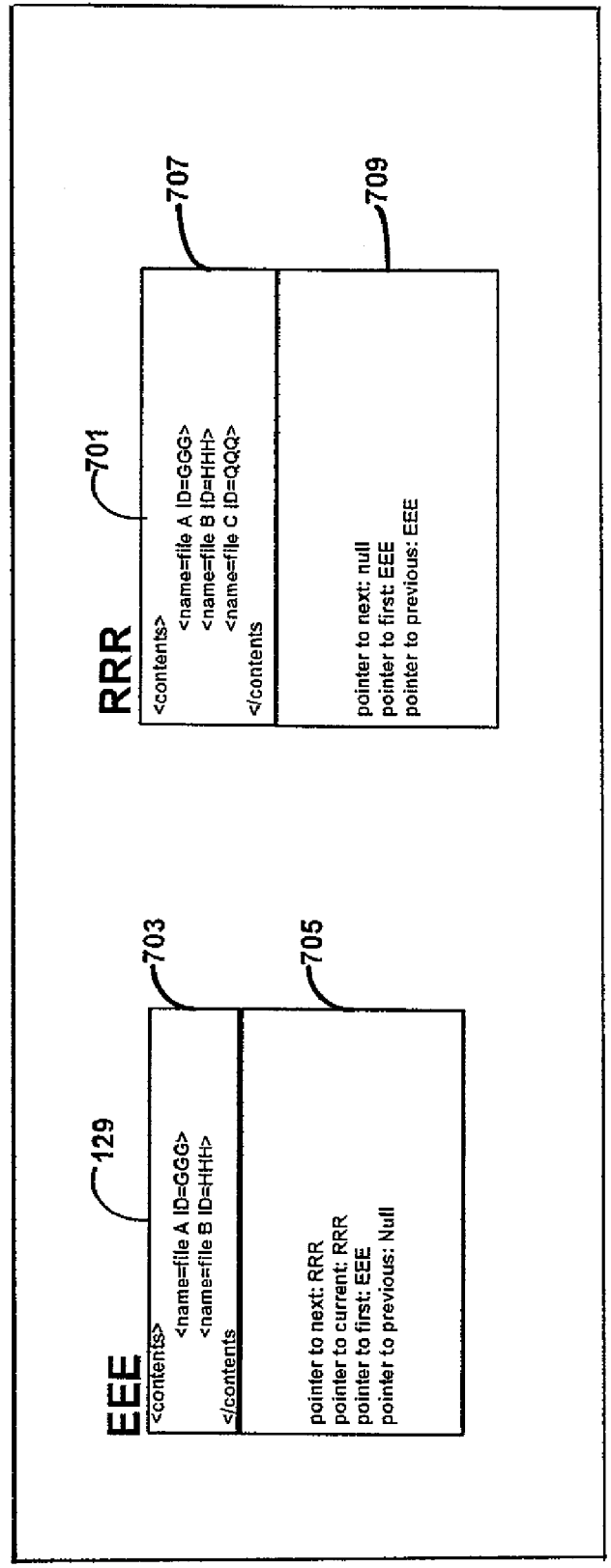
FIG. 7 is a diagram of content units having mutable and non-mutable portions, in accordance with one embodiment.

In an alternate embodiment, when the content of a directory changes, a new content unit may be created to reflect the change. For example, as shown in FIG. 7, content unit 129, which represents the 'holiday pictures' directory, indicates that file A and file B are stored therein. If a third file, file C, is added to the 'holiday pictures' directory, a new content unit 701 may be created reflecting this change. In addition, a pointer may be added into content unit 129 that points to the new content unit (i.e., content unit 701). Content unit 701 may have a pointer that points back to the original content unit (i.e., content unit 129). In addition, each content unit has two portions: a mutable portion and a non-mutable portion. For example, content unit 129 may have non-mutable portion 703 and mutable portion 705. Content unit 701 has non-mutable portion 707 and mutable potion 709. The content address of a content unit is computed using only the non-mutable portion of the content of the content unit. Thus, a change to the mutable portion of the content unit does not change the content address of the content unit.

Thus, for example, if it is desired to access file C that is newly added to the directory structure and is logically stored in the directory path root/personal/holiday pictures (FIG. 1B), the content of file C newly added to the directory structure shown in FIG. 1B, the rendering manager may send a request to the CAS system for the content unit that represents the root directory by providing its content address (i.e., 'XYZ'). In response, the CAS system may return content unit 119, which represents the root directory. Based on the content of this content unit, the rendering manager may determine that the content address of the content unit that represents the 'personal' subdirectory is 'BBB' and may send a request to the CAS system for the content unit having the content address 'BBB.' In response, the CAS system may return content unit 127, which represents the 'personal' subdirectory. Based on the content of content unit 127, it may be determined that the content address of the content unit that represents the 'holiday pictures' subdirectory is 'EEE' and rendering manager may send a request to the CAS system for this content unit. In response, the CAS system may return a content unit 129 which corresponds to the 'holiday pictures' subdirectory. The rendering manager may recognized that content unit 129, as shown in FIG. 7, includes a pointer to another content unit having the content address 'RRR' that is an updated version of the 'holiday pictures' subdirectory and may send a request to the CAS system for a content unit having the content address 'RRR.' In response, the CAS system may return content unit 701 and the rendering manager may request the content unit that represents file C from the CAS system based on the information therein.

Thus, as a result of the addition of file C into the 'holiday pictures' directory, only the pointers in content unit 129 are changed and/or added. It is not necessary to alter the content of any content units that represent directories at higher levels in the directory structure, and therefore not necessary to alter the content addresses that are used to link the content units together to form the directory structure.

Figure 8:
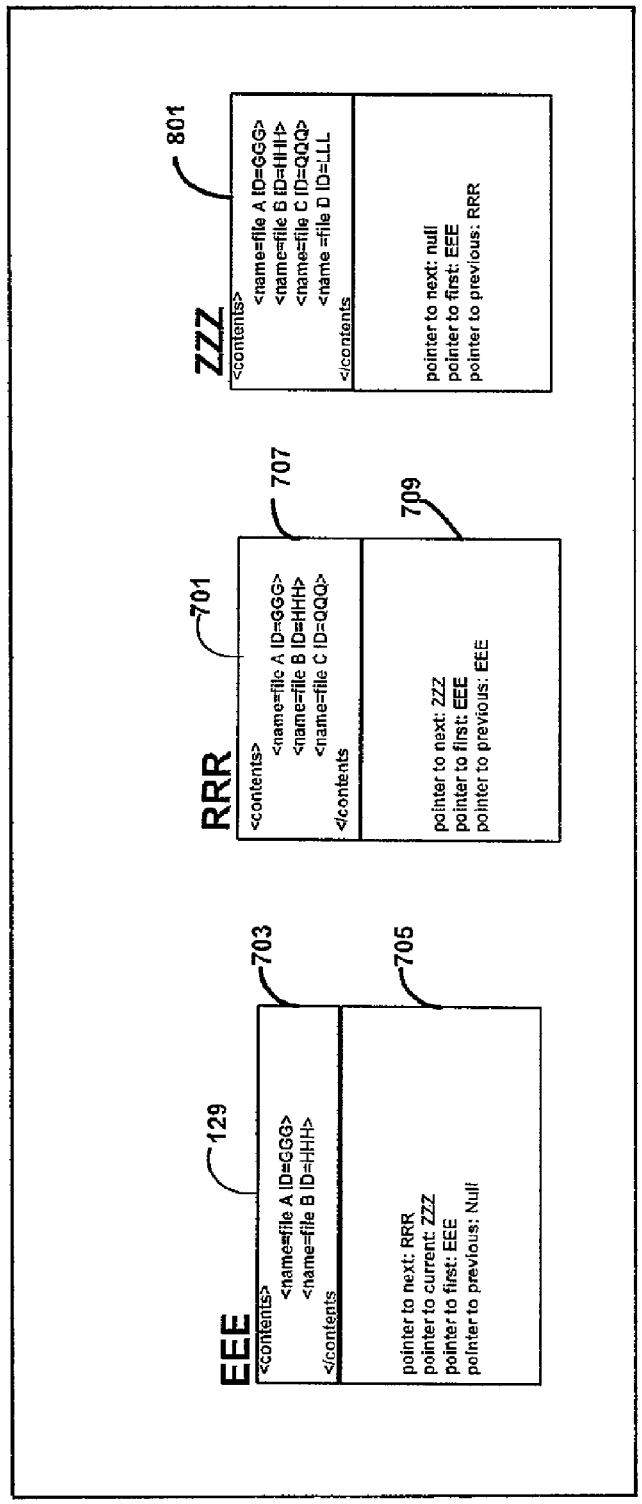
FIG. 8 is a diagram of a chain of content units having mutable and non-mutable portions, in accordance with one embodiment.

If another file, file D, is subsequently stored in the 'holiday pictures' directory, as shown in FIG. 8, a new content unit 801 may be created to reflect this addition. The pointers in the mutable portions of content units 129 and 701 may be updated to indicate that content unit 801 is the current content unit for the 'holiday pictures' directory. Thus, when the rendering manager accesses content unit 129, it may recognize that the content unit includes a pointer to content unit 801 and may use content 801 in place of content unit 129.

By maintaining the intermediate content units in a chain of content units (e.g., rather than deleting them), the directory structure may be reconstructed to reflect the structure of the file system at a specific point in time. For example, in FIG. 8, if after content unit 801 is created, it is desired to "roll back" the directory structure so that it is structured the way it was before File D was added to the 'holiday pictures' directory, then content unit 701 may become the "current" content unit and the pointers of content unit 129 may be updated to reflect this.

However, it should be appreciated that the invention is not limited to maintaining intermediate content units in the chain. For example, in some embodiments, after content unit 801 is created, content unit 701 may be deleted and the pointers of content unit 129 and content unit 801 may be updated to reflect that these are the only two content units in the chain.

The pointers in the mutable portion of a content unit may be implemented in any suitable way, as the invention is not limited in this respect. In one embodiment, a pointer to another content unit may be an indication of the content address of the content unit being referenced by the pointer. However, the invention is not limited in this respect, as the pointer may be implemented in any suitable way. For example, in FIG. 8, the pointer from content unit 129 to the current content unit (i.e., content unit 801) may simply be the content address 'ZZZ.'

Any suitable types of pointers may be maintained, as the invention is not limited in this respect. For example, a chain of content units that previously represented a particular directory along with the content unit that currently represents the directory may be maintained. That is, each content unit in the chain may have a pointer to the previous content unit in the chain, a pointer to the first content unit in the chain, and a pointer to the next content unit in the chain. In addition, the first content unit in the chain may maintain a pointer to the current content unit (i.e., the content unit that currently represents the directory), which allows the rendering manager to locate the current content unit upon retrieval of first content unit in the chain.

It should be appreciated that, in some embodiments, it is not necessary to maintain all of these pointers. For example, in one embodiment, each content unit may have a pointer only to the next content unit in the chain. The most recent content unit may be identified by following the chain of pointers to the end.

By maintaining a pointer or pointers in the mutable portion of a content unit and not changing the metadata that describes the directory structure in the non-mutable portion of the content unit, such metadata may be verified to determine if it has been corrupted. Because this metadata is not intentionally changed, and the content address computed using the metadata (and any other data in the non-mutable portion of the content unit) is known, the content address may be recomputed using the non-mutable portion of the content unit and it may be determined if the recomputed content address is the same as the originally computed content address. If the two content addresses are the same, it may be verified that the non-mutable content has not been altered or corrupted. If the two content addresses are different, then it may be recognized that the non-mutable content has been altered or corrupted and the non-mutable content (or the entire content of the content unit) may be restored from a backup copy of the content unit.

In the examples described above, the rendering manager receives from the CAS system a content unit that includes a pointer to a more current version of the content unit, the rendering manager recognizes that a more current version of the content unit exists, and retrieves the more current version from the CAS system. However, the invention is not limited in this respect. For example, in an alternate embodiment this recognition may be performed by the CAS system instead of the rendering manager. Referring to FIG. 8, when the rendering manager sends a request to the CAS system for the content unit having the content address 'EEE,' the CAS system may locate this content unit, recognize that the content unit points to a more current version (i.e., content unit 801) and may return content unit 801 in response to the request.

Changes to the directory structure may be performed either synchronously or asynchronously, as the invention is not limited in this respect. When performing changes synchronously, a new content unit reflecting the new directory structure may be created and the pointers of previous versions of the content unit may be updated immediately after a user alters the directory structure. When the changes to the directory structure are performed asynchronously, a user may make a change to the directory structure, but the new content unit is not created and the pointers of previous versions of the content unit are not updated until some time after the user makes these changes, for example, at a time when the CAS system is not busy processing other requests or at a time when network traffic is light. However, the updated directory information may be maintained by the rendering manager in a scratch area so that if a user attempts to access a newly created or modified portion of the directory structure that has not yet been created on the CAS system (i.e., due to the asynchronous update), rendering manager may still provide current information on the directory structure.

If a new file is stored in a directory and changes to the directory structure are performed asynchronously, there may be a period of time during which no content address exists for the content unit that represents the directory reflecting the addition of the new file, because the content unit has not yet been created on the CAS system. Thus, if a user attempts to access the CAS-ID file that is virtually stored in the directory, rendering manager may not be able to respond with the content address of the content unit that represents the directory (as it has not yet been created on the CAS system). In one embodiment, when a user accesses the CAS-ID file virtually stored in a directory for which a content unit has not yet been created, rendering manager may send a request to the CAS system to create the new content unit and update the pointers of the previous version or versions of the content unit so that a content address may be generated and returned to the user in response to the user's access of the CAS-ID file. Thus, by accessing the CAS-ID file virtually stored in a particular directory, a user may force the update of the content unit that represents the directory on the CAS system.

In the examples of above, new content units are created to reflect changes to the directory structure caused by the addition of a file into a directory. However, it should be appreciated that the techniques described above for handling modifications to the directory structure may be employed for any modification to the directory structure and are not limited to use with file additions. For example, such techniques may be employed if a subdirectory is added to or deleted from the directory structure, if a file is added to the directory structure, or any other modification.

Further, in the examples above, a new content unit is created in response to a change to the directory structure of a file system so that the content of the original content unit may be updated with the content of the new content unit. However, the invention is not limited to updating the content of the original content unit to reflect the change to a file system. Indeed, the content of content units stored on a CAS system may be updated using the techniques described above for any suitable reason. Further, these techniques may be employed on any content unit, and are not limited to use with content units that represent directories in a directory structure. In some embodiments, such techniques for updating or modifying the content of content units may be employed on CAS systems that are not used in the rendering of a content addressable file system.

In one embodiment, a set of content units for a particular file system may be grouped into a virtual pool. Virtual pools are discussed in detail in application Ser. Nos. 10/910,985; 10/911,330; 10/911,248; 10/911,247; and 10/911,360, listed in Table 2 below. A virtual pool is a logical grouping of content units. Content units may be logically grouped together in virtual pools for any suitable reason. For example, content units may be grouped together to control access to certain content units. That is, a first host computer may be permitted only to access content units in Virtual Pool A, while a second host computer may be permitted only to access content units in Virtual Pool B. Additionally, different storage space quotas, retention periods, and/or replication rules may be assigned to different virtual pools. For example, Virtual Pool A may include content units for a first file system, while Virtual Pool B may include content units for a second file system. A storage space quota of three gigabytes may be imposed on Virtual Pool A, such that once the content units in Virtual Pool A use 3 gigabytes of storage space, no more content units may be added to the virtual pool, while Virtual Pool B has a storage space quota of five gigabytes. As another example, Virtual Pool A may have a retention period of three years such that a content unit in Virtual Pool A may not be deleted for a period of three years after its creation, while content units in Virtual Pool B have a retention period of two years. Moreover, virtual pools may different replication policies. For example, content units in Virtual Pool A may be replicated to a remote storage system, while content units in Virtual Pool B are not replicated.

In one embodiment, aspects of the present invention may be used with a CAS system that stores at least two different types of content units: blobs and CDFs as described in at least some of the Table 2 applications. Data may be stored in logical objects referred to as blobs, while metadata (and optionally some data) is stored in logical objects referred to as content descriptor files (CDFs). CDFs may reference blobs and other CDFs, while blobs do not reference other content units, and typically include data. Thus, CDFs may be used to represent directories in the directory structure, while blobs may be used to represent files stored in the directory structure. That is, for example, referring to FIG. 1B, content units 119, 121, 123, 125, 127, 129, and 131 may be CDFs, while content units 133 and 135 may be blobs. Alternatively, content units 133 and 135 may be CDFs which each reference another content unit which is the blob that stores the content of the file. For example, content unit 133 may be a CDF that references another blob (not shown) which stores the content of File A and content unit 135 may be a CDF that references another which stores the content of File B.

However, aspects of the invention are not limited to implementation on a CAS system that uses blobs and CDFs, as any suitable type(s) of content units may be used.

It may sometimes be desirable to share a content addressable file system that is stored on a CAS system with another user or mount the file system on another computer system. All that is needed to access a file system stored on a CAS system in accordance with the embodiments discussed above, is the content address of the content unit that represents the root directory of the file system. Thus, a first user may share access (e.g., via e-mail or otherwise) to a content addressable file system with a second user by providing the second user with content address of the root directory (which the first user may obtain, for example, via the CAS-ID virtual file). The second user may then mount the file system by providing the rendering manager with this content address, as discussed above.

Applicants have appreciated that, in traditional file systems where the file system mapping information and some or all of the data that is logically stored in the file system is locally stored on the user's system, if the user's system crashes (e.g., due to hardware disk failure or another reason) the file system mapping information and data may have to be restored from backup media (assuming that the file system was previously backed up). Restoring from backup may be a time consuming process, particularly where the file system is large. However, in embodiments that employ a content addressable file system as described herein, if the user's system fails, the file system may be restored by specifying the content address of the content unit that represents the root directory to mount the file system. It is not necessary to copy file system data from backup, because the content units that describe the directory structure and that store file data are stored on the CAS system and were not lost or damaged in the failure of the users's system.

In one embodiment, the CAS system may mirror and/or replicates content units stored thereon. As used herein, mirroring a content unit refers to creating a copy of the content unit on the CAS system and replicating a content unit refers to creating a copy of the content unit on a different CAS system (e.g., a remote CAS system). Because the CAS system automatically performs mirroring and/or replication of content units, a user need not create a backup copy of the file system, as is often done with traditional file systems.

Figure 9A:
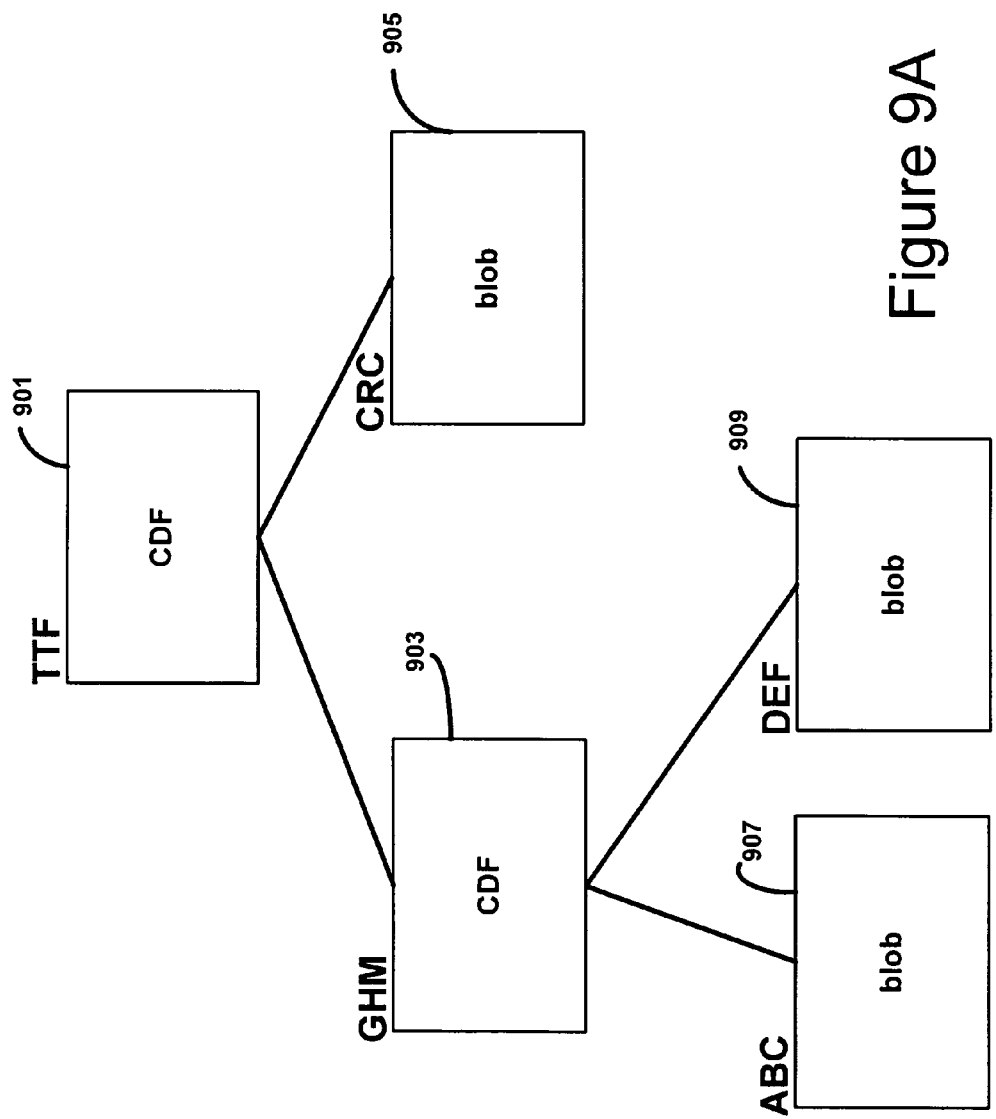
FIG. 9A is a diagram of content units stored on a CAS system.

In the examples above, content units were created to represent directories and files as they were stored by a user. However, in one embodiment, a directory structure may be created to organize content units previously stored on a CAS system (e.g., a CAS system that was not previously used to store file system metadata). This may be done in any suitable way, as this aspect of the invention is not limited to any particular implementation technique. For example, as shown in FIG. 9A, a CAS system may have stored content units 901, 903, 905, 907, and 909. Content unit 901 may be a CDF which includes a reference to another CDF (i.e., content unit 903) and a blob (i.e., content unit 905). CDF 903 may include references to two blobs (i.e., blob 907 and blob 909). In one embodiment, these content units may be organized in a file system, for example, to provide a hierarchical sense of how the content is logically organized (or for any other suitable reason).

Figure 9B:
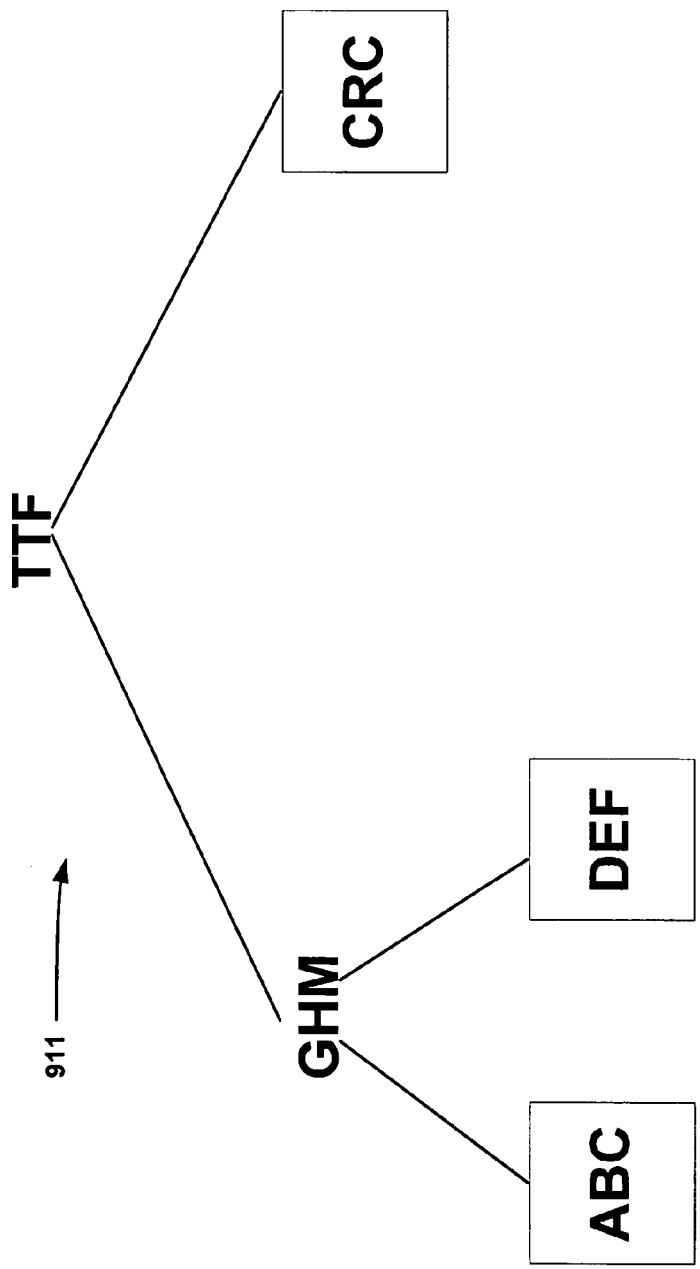
FIG. 9B is a diagram of a directory structure created to represent the relationship between the content units of FIG. 9A, in accordance with one embodiment.

Thus, as shown in FIG. 9B, a CDF may be represented as a directory, with each CDF that it references being represented as a subdirectory of the directory and each blob that it references being represented as a file stored in the directory. Thus, directory structure 911 includes a directory 'TTF' which represents CDF 901. Directory 'GHM' is a subdirectory of directory 'TTF' and represents CDF 903. 'CRC' is a file stored in directory 'TTF' and represents blob 905 and files 'ABC' and 'DEF' are files stored in directory 'GHM' and represent blobs 907 and 909.

The directory structure created from existing content units may be created in any suitable way, using any suitable process. As one example, a CAS system may be used in a company by three different departments, with the engineering department using the CAS system to store software builds, the marketing department using the CAS system to store marketing videos, and the sales department using the CAS system to store sales agreements.

To create the directory structure, first the content addresses of content units that are to form a part of the directory structure may be identified. This may be done in any suitable way, as the invention is not limited in this respect. In one embodiment, content units may be identified by performing a time-based query on the CAS system. A time based query is a request to identify all content units that were stored on the CAS system during a time range specified in the request. Thus, for example, in one embodiment where all content units stored on the CAS system are to form a part of the directory structure, the time range specified in the request may be the range starting at the time when the first content unit was stored on the CAS system and ending at the current time.

Next, for each content address identified, the content unit associated with the content unit may be accessed and information indicating whether the content unit was stored by the engineering department, the sales department, or the marketing department may be retrieved from the content unit. Thus, it may be determined which content units are "sales" content units, which are "marketing" content units, and which are "engineering" content units.

Three new content units may then be created. The first of the new content units may be a content unit that represents a "sales" directory and may include references to all of the "sales" content units, the second may be a content unit that represents a "marketing" directory and may include references to all of the "marketing" content units, and the third may be a content unit that represents an "engineering" directory and may include references to all of the "engineering" content units.

In addition, a root content unit may be created that represents the root directory of the file system. The root content unit may include references to the content unit that represents the "sales" directory, the content unit that represents the "marketing" directory, and the content unit that represents the "engineering" directory. The file system may then be mounted using the content address of the root content unit.

In one embodiment in which the "sales" content units, "marketing" content units, and "engineering" content units were initially written in a hierarchical fashion, it may not be necessary to create a content unit that represents the sales directory, a content unit that represents the marketing directory, and/or a content unit that represents the engineering directory.

In one embodiment of the invention, the storage space available for use by a particular content addressable file system is limited to the amount of free storage space on the CAS system. In another embodiment, the storage space available for use by a content addressable file system may be expanded beyond the amount of free storage space on the CAS system by providing a second CAS system and creating a federation of CAS systems that includes both the first and second CAS systems. Federations of CAS systems are described in detail in application Ser. Nos. 10/787,337 and 10/787,670 listed in Table 2 below. A federation is the grouping of two or more CAS systems, wherein the group of CAS systems may be treated by a user as a single CAS system. Thus, the available storage capacity for use in storing file system content may be expanded by adding additional CAS systems into the federation.

The content addressable features of the file system provide the ability to verify that the directory structure information and the content stored in the file system have not been corrupted (e.g., when being transferred over a network or while stored on the CAS system) because this information is stored in content units. That is, in one embodiment, it may be determined if a content unit has been corrupted by re-computing the content address of the content unit. If the content of the content unit has been corrupted, the computation may yield a different content address than the original content address for the content unit and mirror copy or replicated copy of the content unit may be used to replace the content unit. If the computation yields the same content address, it may be verified that the content of the content unit has not changed.

In the examples above, content units stored on a content addressable storage system are accessed via file system commands generated by a user or another entity. In one embodiment, in addition to permitting access to a content unit stored on the content addressable storage system via a file system, a user may access the content unit by sending a read request to the content addressable storage system that specifies the content address of the content unit. Thus, if the user knows the content address of the content unit, the user may, instead of making a file system access that is translated into a content addressable access request by the rendering manager, send an access request that specifies the content address of the content unit to the CAS system and may receive the content unit in response to this request. Such content addressable access requests are described in greater detail in the applications listed below in Table 2.

In some embodiments, a content addressable file system that is stored on a CAS system may be portable. That is, the same content addressable file system may be mounted on both a first host computer that uses a first platform and a second host computer that uses a second platform. This may be done in any suitable way, as the invention is not limited in this respect.

Figure 10:
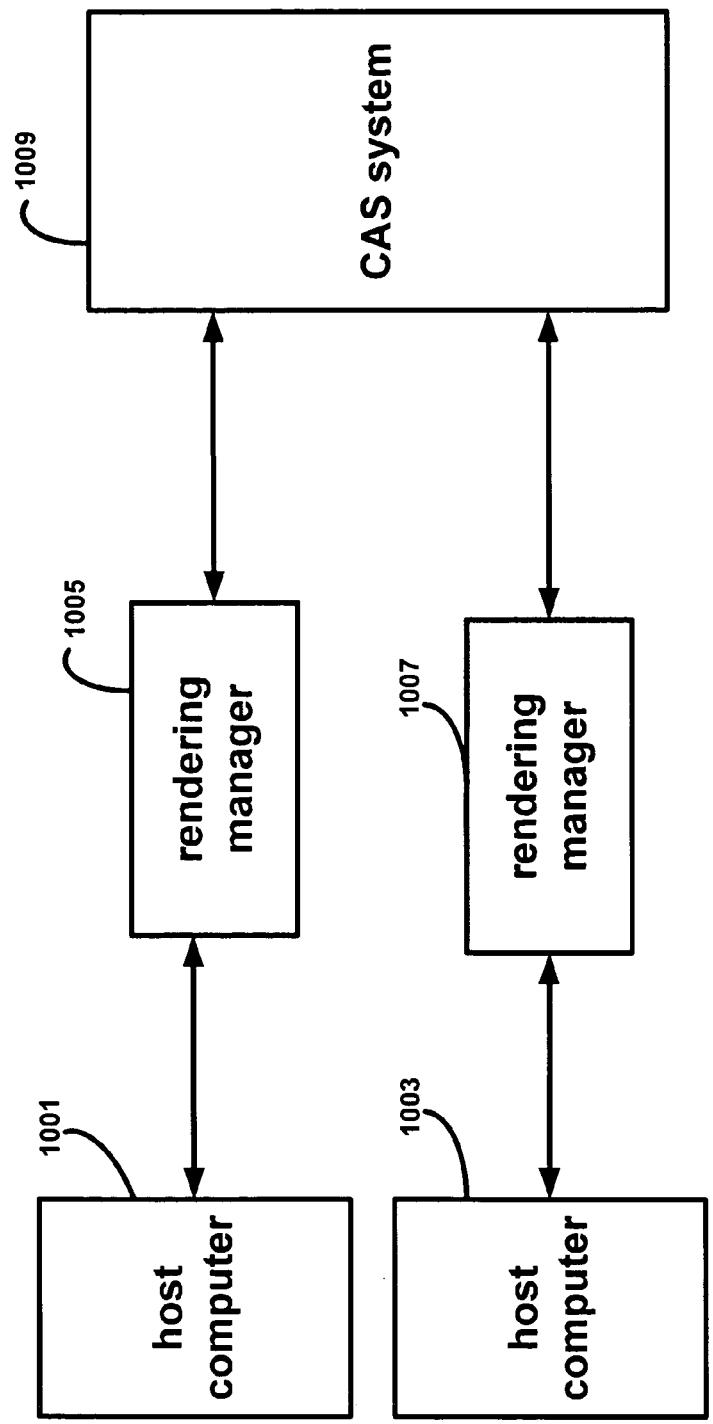
FIG. 10 is a diagram showing two hosts having different platforms, two rendering managers and a CAS system in accordance with one embodiment.

For example, as shown in FIG. 10, host computer 1001 may use the Linux platform and host computer 1003 may use the Windows™ platform. A content addressable file system may be stored on CAS system 1009. Thus, rendering manager 1005 may be capable of converting file system calls for a Linux platform to content addressable access requests to be sent to CAS system 1009 and rendering manager 1007 may be capable of converting file system calls for a Windows™ platform to content addressable access requests to be sent to CAS system 1009. However, both rendering manager 1005 and 1007 may access the same set of content units that make up a content addressable file system.

In one embodiment, rendering manager 1005 and rendering manager 1007 may store file system metadata in content units using a common format so that file system metadata stored in a content unit by rendering manager 1005 may be read and understood by rendering manager 1007 and file system metadata stored in a content unit by rendering manager 1007 may be read and understood by rendering manager 1005.

The file system may be mounted by both host computers at the same time and used simultaneously, or may be used by one of the host computers only when the file system is not in use (e.g., mounted) by the other host computer, as the invention is not limited in this respect. Further, in the embodiment shown in FIG. 10, two hosts having different platforms are capable of mounting the same content addressable file system. However, the embodiment of the invention is not limited to use with only two different platforms or host computers, as the content addressable file system may be used with any suitable number (e.g., one, three, or more) of different platforms or host computers. In addition, the invention is not limited to use with the two types of platforms given in the example of FIG. 10 (i.e., Linux and Windows™), as any other platform for which a rendering manager can translate file system calls into content addressable access requests may be used to mount a content addressable file system.

Additionally, in the examples above a separate rendering manager is used by each host computer. However, the invention is not limited in this respect, as in some embodiments wherein the rendering manager is implemented on an appliance or on the CAS system, multiple host computers, regardless of the platform used, may use the same rendering manager. In this respect, the rendering manger may be capable of recognizing file system calls of multiple different platforms and converting those file system calls into content addressable access requests.

The above-described embodiments of the present invention can be implemented on any suitable computer or system. Examples of suitable computers and/or systems are described in the patent applications listed below in Table 2 (collectively "the CAS applications"), each of which is incorporated herein by reference. It should be appreciated that the computers and systems described in these applications are only examples of computers and systems on which the embodiments of the present invention may be implemented, as the invention is not limited to implementation on any of these content addressable storage systems, or to content addressable storage systems at all.

TABLE 2

| Title | Ser. No. | Filing Date |
|---|---|---|
| Content Addressable Information, Encapsulation, Representation, And Transfer | 09/236,366 | Jan. 21, 1999 |
| Access To Content Addressable Data Over A Network | 09/235,146 | Jan. 21, 1999 |
| System And Method For Secure Storage Transfer And Retrieval Of Content Addressable Information | 09/391,360 | Sep. 7, 1999 |
| Method And Apparatus For Data Retention In A Storage System | 10/731,790 | Dec. 9, 2003 |
| Methods And Apparatus For Facilitating Access To Content In A Data Storage System | 10/731,613 | Dec. 9, 2003 |
| Methods And Apparatus For Caching A Location Index In A Data Storage System | 10/731,796 | Dec. 9, 2003 |
| Methods And Apparatus For Parsing A Content Address To Facilitate Selection Of A Physical Storage Location In A Data Storage System | 10/731,603 | Dec. 9, 2003 |
| Methods And Apparatus For Generating A Content Address To Indicate Data Units Written To A Storage System Proximate In Time | 10/731,845 | Dec. 9, 2003 |
| Methods And Apparatus For Modifying A Retention Period For Data In A Storage System | 10/762,044 | Jan. 21, 2004 |

TABLE 2-continued

| Title | Ser. No. | Filing Date |
|---|---|---|
| Methods And Apparatus For Extending A Retention Period For Data In A Storage System | 10/761,826 | Jan. 21, 2004 |
| Methods And Apparatus For Indirectly Identifying A Retention Period For Data In A Storage System | 10/762,036 | Jan. 21, 2004 |
| Methods And Apparatus For Indirectly Identifying A Retention Period For Data In A Storage System | 10/762,043 | Jan. 21, 2004 |
| Methods And Apparatus For Increasing Data Storage Capacity | 10/787,337 | Feb. 26, 2004 |
| Methods And Apparatus For Storing Data In A Storage Environment | 10/787,670 | Feb. 26, 2004 |
| Methods And Apparatus For Segregating A Content Addressable Computer System | 10/910,985 | Aug. 4, 2004 |
| Methods And Apparatus For Accessing Content In A Virtual Pool On A Content Addressable Storage System | 10/911,330 | Aug. 4, 2004 |
| Methods and Apparatus For Including Storage System Capability Information In An Access Request To A Content Addressable Storage System | 10/911,248 | Aug. 4, 2004 |
| Methods And Apparatus For Tracking Content Storage In A Content Addressable Storage System | 10/911,247 | Aug. 4, 2004 |
| Methods and Apparatus For Storing Information Identifying A Source Of A Content Unit Stored On A Content Addressable System | 10/911,360 | Aug. 4, 2004 |
| Software System For Providing Storage System Functionality | 11/021,892 | Dec. 23, 2004 |
| Software System For Providing Content Addressable Storage System Functionality | 11/022,022 | Dec. 23, 2004 |
| Methods And Apparatus For Providing Data Retention Capability Via A Network Attached Storage Device | 11/022,077 | Dec. 23, 2004 |
| Methods And Apparatus For Managing Storage In A Computer System | 11/021,756 | Dec. 23, 2004 |
| Methods And Apparatus For Processing Access Requests In A Computer System | 11/021,012 | Dec. 23, 2004 |
| Methods And Apparatus For Accessing Information In A Hierarchical File System | 11/021,378 | Dec. 23, 2004 |
| Methods And Apparatus For Storing A Reflection On A Storage System | 11/034,613 | Jan. 12, 2005 |
| Method And Apparatus For Modifying A Retention Period | 11/034,737 | Jan. 12, 2005 |
| Methods And Apparatus For Managing Deletion of Data | 11/034,732 | Jan. 12, 2005 |
| Methods And Apparatus For Managing The Storage | 11/107,520 | Apr. 15, 2005 |

TABLE 2-continued

| Title | Ser. No. | Filing Date |
|---|---|---|
| Methods And Apparatus For Retrieval Of Content Units In A Time-Based Directory Structure Of Content | 11/107,063 | Apr. 15, 2005 |
| Methods And Apparatus For Managing The Replication Of Content | 11/107,194 | Apr. 15, 2005 |
| Methods And Apparatus For Managing the Storage Of Content In A File System | 11/165,104 | Jun. 23, 2005 |
| Methods And Apparatus For Accessing Content Stored In A File System | 11/165,103 | Jun. 23, 2005 |
| Methods And Apparatus For Storing Content In A File System | 11/165,102 | Jun. 23, 2005 |

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. It should be appreciated that any component or collection of components that perform the functions described above can be generically considered as one or more controllers that control the above-discussed functions. The one or more controllers can be implemented in numerous ways, such as with dedicated hardware, or with general purpose hardware (e.g., one or more processors) that is programmed using microcode or software to perform the functions recited above.

In this respect, it should be appreciated that one implementation of the embodiments of the present invention comprises at least one computer-readable medium (e.g., a computer memory, a floppy disk, a compact disk, a tape, etc.) encoded with a computer program (i.e., a plurality of instructions), which, when executed on a processor, performs the above-discussed functions of the embodiments of the present invention.

The computer-readable medium can be transportable such that the program stored thereon can be loaded onto any computer environment resource to implement the aspects of the present invention discussed herein. In addition, it should be appreciated that the reference to a computer program which, when executed, performs the above-discussed functions, is not limited to an application program running on a host computer. Rather, the term computer program is used herein in a generic sense to reference any type of computer code (e.g., software or microcode) that can be employed to program a processor to implement the above-discussed aspects of the present invention.

It should be appreciated that in accordance with several embodiments of the present invention wherein processes are implemented in a computer readable medium, the computer implemented processes may, during the course of their execution, receive input manually (e.g., from a user).

The phraseology and terminology used herein is for the purpose of description and should not be regarded as limiting. The use of "including," "comprising," "having," "containing", "involving", and variations thereof, is meant to encompass the items listed thereafter and additional items.

Having described several embodiments of the invention in detail, various modifications and improvements will readily occur to those skilled in the art. Such modifications and improvements are intended to be within the spirit and scope of the invention. Accordingly, the foregoing description is by way of example only, and is not intended as limiting. The invention is limited only as defined by the following claims and the equivalents thereto.

What is claimed is:

1. A method, implemented in a computer system, of accessing a file content unit stored on a content addressable storage system, comprising:
   receiving a request to access the file content unit, wherein the request provides the logical identifier for the file content unit, wherein the logical identifier is a file system location in a file system;
   accessing a first content unit corresponding to a directory of the file system in a directory path containing the file content unit, wherein the first content unit is different from the file content unit;
   reading metadata stored in the first content unit;
   determining a content address of the file content unit using the first content unit, wherein determining the content address of the file content unit includes using the metadata stored in the first content unit to map to a content address of at least one other content unit, that is different from the first content unit and the file content unit, and using additional information correlating the content address of the file content unit with information indicating where the file content unit is logically stored as a logical unit identified by the logical identifier, wherein the content address of the file content unit is computed, at least in part, from at least a portion of content of the file content unit, wherein the metadata in the first content unit identifies the at least one other content address for the at least one other content unit, and wherein the at least one other content address is computed, at least in part, from at least a portion of content of the at least one other content unit; and
   accessing the file content unit via the content address of the file content unit.

2. The method of claim 1, wherein the file content unit is a first file content unit and the content address is a first content address, and wherein at least some of the metadata is stored on the content addressable storage system as a second file content unit identified by a second content address.

3. The method of claim 1, wherein the content of the at least one other content unit includes a mutable portion and a non-mutable portion.

4. At least one non-transitory computer readable medium encoded with a plurality of instructions that, when executed, perform a method of accessing a file content unit stored on a content addressable storage system, the method comprising:
   receiving a request to access the file content unit, wherein the request provides the logical identifier for the file content unit, wherein the logical identifier is a file system location in a file system;
   accessing a first content unit corresponding to a directory of the file system in a directory path containing the file content unit, wherein the first content unit is different from the file content unit;
   reading metadata stored in the first content unit;
   determining a content address of the file content unit using the first content unit, wherein determining the content address of the file content unit includes using the metadata stored in the first content unit to map to a content address of at least one other content unit, that is different from the first content unit and the file content unit, and using additional information correlating the content address of the file content unit with information indicating where the file content unit is logically stored as a logical unit identified by the logical identifier, wherein the content address of the file content unit is computed, at least in part, from at least a portion of content of the file content unit, wherein the metadata in the first content unit identifies the at least one other content address for the at least one other content unit, and wherein the at least one other content address is computed, at least in part, from at least a portion of content of the at least one other content unit; and accessing the file content unit via the content address of the file content unit.

5. The at least one non-transitory computer readable medium of claim 4, wherein the file content unit is a first file content unit and the content address is a first content address, and wherein at least some of the metadata is stored on the content addressable storage system as a second file content unit identified by a second content address.

6. The at least one non-transitory computer readable medium of claim 4, wherein the content of the at least one other content unit includes a mutable portion and a non-mutable portion.

7. An apparatus to access a file content unit stored on a content addressable storage system, the apparatus comprising:
at least one processor programmed to:
receive a request to access the file content unit, wherein the request provides the logical identifier for the file content unit, wherein the logical identifier is a file system location in a file system;
access a first content unit corresponding to a directory of the file system in a directory path containing the file content unit, wherein the first content unit is different from the file content unit;
determining a content address of the file content unit using the first content unit, wherein determining the content address of the file content unit includes using the metadata stored in the first content unit to map to a content address of at least one other content unit, that is different from the first content unit and the file content unit, and using additional information correlating the content address of the file content unit with information indicating where the file content unit is logically stored as a logical unit identified by the logical identifier, wherein the content address of the file content unit is computed, at least in part, from at least a portion of content of the file content unit, wherein the metadata in the first content unit identifies the at least one other content address for the at least one other content unit, and wherein the at least one other content address is computed, at least in part, from at least a portion of content of the at least one other content unit; and access the file content unit via the content address of the file content unit.

8. The apparatus of claim 7, wherein the at least one processor is disposed on the CAS system.

9. The apparatus of claim 7, wherein the CAS system is disposed in a computer system comprising the CAS system and at least one host computer that accesses at least some of the plurality of content units, and wherein the at least one processor is disposed on the at least one host computer.

10. The apparatus of claim 7, wherein the CAS system is disposed in a computer system comprising the CAS system, at least one host computer that accesses at least some of the plurality of content units and at least one appliance that is separate from the at least one host computer and the CAS system, and wherein the at least one processor is disposed on the at least one appliance.

11. The apparatus of claim 7, wherein the file content unit is a first file content unit and the content address is a first content address, and wherein at least some of the metadata is stored on the content addressable storage system as a second file content unit identified by a second content address.

12. The apparatus of claim 7, wherein the content of the at least one other content unit includes a mutable portion and a non-mutable portion.

* * * * *